(12) United States Patent  
Van Duren et al.

(10) Patent No.: US 8,309,163 B2
(45) Date of Patent: *Nov. 13, 2012

(54) HIGH-THROUGHPUT PRINTING OF SEMICONDUCTOR PRECURSOR LAYER BY USE OF CHALCOGEN-CONTAINING VAPOR AND INTER-METALLIC MATERIAL

(75) Inventors: Jeroen K. J. Van Duren, Menlo Park, CA (US); Matthew R. Robinson, East Palo Alto, CA (US); Brian M. Sager, Palo Alto, CA (US)

(73) Assignee: Nanosolar, Inc., San Jose, CA (US)

( * ) Notice: Subject to any disclaimer, the term of this patent is extended or adjusted under 35 U.S.C. 154(b) by 1578 days.

This patent is subject to a terminal disclaimer.

(21) Appl. No.: 11/395,668

(22) Filed: Mar. 30, 2006

(65) Prior Publication Data

US 2007/0163644 A1    Jul. 19, 2007

Related U.S. Application Data

(63) Continuation-in-part of application No. 11/361,522, filed on Feb. 23, 2006, now abandoned, which is a continuation-in-part of application No. 11/290,633, filed on Nov. 29, 2005, now Pat. No. 8,048,477, and a continuation-in-part of application No. 10/782,017, filed on Feb. 19, 2004, now Pat. No. 7,663,057, said application No. 11/395,668 is a continuation-in-part of application No. 10/943,657, filed on Sep. 18, 2004, now Pat. No. 7,306,823, and a continuation-in-part of application No. 11/081,163, filed on Mar. 16, 2005, now Pat. No. 7,604,843, and a continuation-in-part of application No. 10/943,685, filed on Sep. 18, 2004, and a continuation-in-part of application No. 11/361,464, filed on Feb. 23, 2006, now abandoned.

(51) Int. Cl.
*B05D 5/12*    (2006.01)
*B05D 3/02*    (2006.01)

(52) U.S. Cl. ........................................ 427/74; 427/376.1

(58) Field of Classification Search .............. 427/64–68, 427/376.1, 74
See application file for complete search history.

(56) References Cited

U.S. PATENT DOCUMENTS 3,423,301 A    1/1969    Stearns
(Continued)

FOREIGN PATENT DOCUMENTS

DE    2741954 A    3/1979
(Continued)

OTHER PUBLICATIONS

Definition of Intermetallic from Merriam-Webster's Collegiate Dictionary, Tenth Edition principal copyright 1993, p. 611.*

(Continued)

*Primary Examiner* — Nathan Empie
(74) *Attorney, Agent, or Firm* — Joshua D. Isenberg; JDI Patent

(57) ABSTRACT

A high-throughput method of forming a semiconductor precursor layer by use of a chalcogen-containing vapor is disclosed. In one embodiment, the method comprises forming a precursor material comprising group IB and/or group IIIA particles of any shape. The method may include forming a precursor layer of the precursor material over a surface of a substrate. The method may further include heating the particle precursor material in a substantially oxygen-free chalcogen atmosphere to a processing temperature sufficient to react the particles and to release chalcogen from the chalcogenide particles, wherein the chalcogen assumes a liquid form and acts as a flux to improve intermixing of elements to form a group IB-IIIA-chalcogenide film at a desired stoichiometric ratio. The chalcogen atmosphere may provide a partial pressure greater than or equal to the vapor pressure of liquid chalcogen in the precursor layer at the processing temperature.

85 Claims, 12 Drawing Sheets

U.S. PATENT DOCUMENTS

| | | |
|---|---|---|
| 3,586,541 A | 6/1971 | Chamberlin |
| 3,891,519 A | 6/1975 | Grellet |
| 3,907,566 A | 9/1975 | Inoue et al. |
| 3,966,568 A | 6/1976 | Crossley et al. |
| 4,104,134 A | 8/1978 | Roberts et al. |
| 4,167,644 A | 9/1979 | Kurth et al. |
| 4,191,794 A | 3/1980 | Shirland et al. |
| 4,192,721 A | 3/1980 | Fawcett et al. |
| 4,394,529 A | 7/1983 | Gounder |
| 4,404,422 A | 9/1983 | Green et al. |
| 4,410,758 A | 10/1983 | Grolitzer |
| 4,522,663 A | 6/1985 | Ovshinsky et al. |
| 4,536,607 A | 8/1985 | Wiesmann |
| 4,598,306 A | 7/1986 | Nath et al. |
| 4,622,432 A | 11/1986 | Yamazaki |
| 4,642,140 A | 2/1987 | Noufi et al. |
| 4,677,250 A | 6/1987 | Barnett et al. |
| 4,806,436 A | 2/1989 | Tada et al. |
| 4,838,951 A | 6/1989 | Riermeier et al. |
| 4,940,604 A | 7/1990 | Suyama et al. |
| 5,013,464 A | 5/1991 | Sugimura et al. |
| 5,045,409 A | 9/1991 | Eberspacher et al. |
| 5,078,804 A | 1/1992 | Chen et al. |
| 5,141,564 A | 8/1992 | Chen et al. |
| 5,244,509 A | 9/1993 | Arao et al. |
| 5,275,714 A | 1/1994 | Bonnet et al. |
| 5,277,786 A | 1/1994 | Kawakami |
| 5,286,306 A | 2/1994 | Menezes |
| 5,356,839 A | 10/1994 | Tuttle et al. |
| 5,401,573 A | 3/1995 | Babel et al. |
| 5,419,781 A | 5/1995 | Hamakawa et al. |
| 5,436,204 A | 7/1995 | Albin et al. |
| 5,441,897 A | 8/1995 | Noufi et al. |
| 5,445,847 A | 8/1995 | Wada et al. |
| 5,489,372 A | 2/1996 | Hirano |
| 5,501,786 A | 3/1996 | Gremion et al. |
| 5,538,903 A | 7/1996 | Aramoto et al. |
| 5,558,723 A | 9/1996 | Ufert |
| 5,567,469 A | 10/1996 | Wada et al. |
| 5,578,503 A | 11/1996 | Karg et al. |
| 5,626,688 A | 5/1997 | Probst et al. |
| 5,633,033 A | 5/1997 | Nishitani et al. |
| 5,674,555 A | 10/1997 | Birkmire et al. |
| 5,677,250 A | 10/1997 | Knapp |
| 5,728,231 A | 3/1998 | Negami et al. |
| 5,730,852 A | 3/1998 | Bhattacharya et al. |
| 5,925,228 A | 7/1999 | Panitz et al. |
| 5,945,217 A | 8/1999 | Hanrahan |
| 5,951,785 A | 9/1999 | Uchihashi et al. |
| 5,985,691 A | 11/1999 | Basol et al. |
| 5,994,163 A | 11/1999 | Bodegaard et al. |
| 6,022,487 A | 2/2000 | Daume et al. |
| 6,051,774 A | 4/2000 | Yoshida et al. |
| 6,107,562 A | 8/2000 | Hashimoto et al. |
| 6,117,454 A | 9/2000 | Kreuter et al. |
| 6,121,541 A | 9/2000 | Arya |
| 6,124,039 A | 9/2000 | Goetz et al. |
| 6,124,041 A | 9/2000 | Aoude et al. |
| 6,126,740 A | 10/2000 | Schulz et al. |
| 6,127,202 A * | 10/2000 | Kapur et al. .................. 438/47 |
| 6,150,022 A | 11/2000 | Coulter et al. |
| 6,201,180 B1 | 3/2001 | Meyer et al. |
| 6,228,904 B1 | 5/2001 | Yadav et al. |
| 6,258,620 B1 | 7/2001 | Morel et al. |
| 6,268,014 B1 * | 7/2001 | Eberspacher et al. .......... 427/74 |
| 6,323,417 B1 | 11/2001 | Gillespie et al. |
| 6,344,272 B1 | 2/2002 | Oldenburg et al. |
| 6,372,538 B1 | 4/2002 | Wendt et al. |
| 6,454,886 B1 | 9/2002 | Martin et al. |
| 6,472,459 B2 | 10/2002 | Morales et al. |
| 6,500,733 B1 | 12/2002 | Stanbery |
| 6,518,086 B2 * | 2/2003 | Beck et al. ..................... 438/95 |
| 6,593,690 B1 | 7/2003 | Mccormick et al. |
| 6,641,898 B2 | 11/2003 | Yazaki et al. |
| 6,685,986 B2 | 2/2004 | Oldenburg et al. |
| 6,897,603 B2 | 5/2005 | Mao et al. |
| 6,908,496 B2 | 6/2005 | Halas et al. |
| 6,951,398 B2 | 10/2005 | Borra et al. |
| 6,974,976 B2 | 12/2005 | Hollars |
| 7,144,627 B2 | 12/2006 | Halas et al. |
| 7,238,879 B2 | 7/2007 | Matsushita et al. |
| 2002/0006470 A1 | 1/2002 | Eberspacher et al. |
| 2002/0066828 A1 | 6/2002 | Nakamura et al. |
| 2002/0132045 A1 | 9/2002 | Halas et al. |
| 2002/0160195 A1 | 10/2002 | Halas et al. |
| 2002/0179140 A1 | 12/2002 | Toyomura |
| 2002/0187347 A1 | 12/2002 | Halas et al. |
| 2003/0051664 A1 | 3/2003 | Stanbery |
| 2003/0052382 A1 | 3/2003 | Stanbery |
| 2003/0052391 A1 | 3/2003 | Stanbery |
| 2003/0054582 A1 | 3/2003 | Stanbery |
| 2003/0054661 A1 | 3/2003 | Stanbery |
| 2003/0054662 A1 | 3/2003 | Stanbery |
| 2003/0054663 A1 | 3/2003 | Stanbery |
| 2003/0059820 A1 | 3/2003 | Vo-Dinh |
| 2003/0175004 A1 | 9/2003 | Garito et al. |
| 2003/0192584 A1 | 10/2003 | Beckenbaugh et al. |
| 2003/0205270 A1 | 11/2003 | Stanbery |
| 2003/0211646 A1 | 11/2003 | Stanbery |
| 2004/0033345 A1 | 2/2004 | Dubertret et al. |
| 2004/0144419 A1 | 7/2004 | Fix et al. |
| 2004/0214001 A1 | 10/2004 | Oldenburg et al. |
| 2004/0219730 A1 * | 11/2004 | Basol ............................ 438/200 |
| 2005/0022747 A1 | 2/2005 | Stanbery |
| 2005/0035983 A1 | 2/2005 | Cruchon-Dupeyrat et al. |
| 2005/0056863 A1 | 3/2005 | Negami et al. |
| 2005/0058587 A1 | 3/2005 | Wagner |
| 2005/0074551 A1 | 4/2005 | Huang et al. |
| 2005/0150789 A1 | 7/2005 | Crane |
| 2005/0175836 A1 | 8/2005 | Kuehnle et al. |
| 2005/0183767 A1 | 8/2005 | Yu et al. |
| 2005/0183768 A1 | 8/2005 | Roscheisen et al. |
| 2005/0186342 A1 | 8/2005 | Sager et al. |
| 2005/0186805 A1 | 8/2005 | Stanbery |
| 2005/0194036 A1 | 9/2005 | Basol |
| 2005/0194038 A1 | 9/2005 | Brabec et al. |
| 2005/0202589 A1 | 9/2005 | Basol |
| 2005/0235869 A1 | 10/2005 | Cruchon-Dupeyrat et al. |
| 2005/0247340 A1 | 11/2005 | Zeira |
| 2005/0266600 A1 | 12/2005 | Basol |
| 2005/0268962 A1 | 12/2005 | Gaudiana et al. |
| 2005/0272263 A1 | 12/2005 | Brabec et al. |
| 2006/0054506 A1 | 3/2006 | Natan et al. |
| 2006/0099146 A1 | 5/2006 | Chow et al. |
| 2006/0121701 A1 | 6/2006 | Basol |
| 2006/0134505 A1 | 6/2006 | Wang et al. |
| 2006/0159922 A1 | 7/2006 | O'Keefe |
| 2006/0165911 A1 | 7/2006 | Basol |
| 2006/0178012 A1 | 8/2006 | Basol |
| 2006/0189155 A1 | 8/2006 | Basol |
| 2006/0192955 A1 | 8/2006 | Jorgenson et al. |
| 2006/0207644 A1 | 9/2006 | Robinson et al. |
| 2006/0251874 A1 | 11/2006 | Mcclure et al. |
| 2007/0044834 A1 | 3/2007 | Berke et al. |
| 2007/0092648 A1 | 4/2007 | Duren et al. |
| 2007/0093006 A1 | 4/2007 | Basol |
| 2007/0093059 A1 | 4/2007 | Basol |
| 2007/0111367 A1 | 5/2007 | Basol |
| 2007/0145507 A1 | 6/2007 | Basol |
| 2007/0163383 A1 | 7/2007 | Van Duren et al. |
| 2007/0163637 A1 | 7/2007 | Robinson et al. |
| 2007/0163638 A1 | 7/2007 | Van Duren et al. |
| 2007/0163639 A1 | 7/2007 | Robinson et al. |
| 2007/0163640 A1 | 7/2007 | Van Duren et al. |
| 2007/0163642 A1 | 7/2007 | Van Duren et al. |
| 2007/0163643 A1 | 7/2007 | Van Duren et al. |
| 2007/0163644 A1 | 7/2007 | Van Duren et al. |
| 2007/0166453 A1 | 7/2007 | Van Duren et al. |
| 2007/0166964 A1 | 7/2007 | Basol |
| 2007/0169809 A1 | 7/2007 | Van Duren et al. |
| 2007/0169810 A1 | 7/2007 | Van Duren et al. |
| 2007/0169811 A1 | 7/2007 | Van Duren et al. |
| 2007/0169812 A1 | 7/2007 | Robinson et al. |
| 2007/0169813 A1 | 7/2007 | Robinson et al. |
| 2007/0178620 A1 | 8/2007 | Basol |
| 2008/0121277 A1 | 5/2008 | Robinson et al. |
| 2008/0124831 A1 | 5/2008 | Robinson et al. |

FOREIGN PATENT DOCUMENTS

| | | | |
|---|---|---|---|
| EP | 793277 | A | 9/1997 |
| JP | 61244004 | A | 10/1986 |
| JP | 6289369 | | 4/1987 |
| JP | 63249379 | A | 10/1988 |
| JP | 2001044464 | A | 2/2001 |
| KR | 2005119705 | A | 12/2005 |
| WO | 02084708 | A | 10/2002 |
| WO | 03007386 | A1 | 1/2003 |
| WO | 03043736 | A | 5/2003 |

OTHER PUBLICATIONS

Office Action dated Aug. 25, 2010 for U.S. Appl. No. 11/243,522. (NSL-044).
Office Action dated Aug. 28, 2008 for U.S. Appl. No. 11/361,688.
Office Action dated Dec. 12, 2008 for U.S. Appl. No. 11/361,515.
Office Action dated Dec. 22, 2009 for U.S. Appl. No. 11/253,522. (NSL-044).
Office Action dated Dec. 23, 2008 for U.S. Appl. No. 11/395,668.
Office Action dated Dec. 24, 2008 for U.S. Appl. No. 11/361,522.
Office Action dated Dec. 26, 2008 for U.S. Appl. No. 11/361,523.
Office Action dated Dec. 31, 2007 for U.S. Appl. No. 10/782,017. (NSL-029).
Office Action dated Feb. 2, 2011 for U.S. Appl. No. 11/933,357. (NSL-0126).
Office Action dated Feb. 9, 2007 for U.S. Appl. No. 10/943,657. (NSL-033).
Office Action dated Feb. 9, 2009 for U.S. Appl. No. 11/395,426.
Office Action dated Feb. 18, 2010 for U.S. Appl. No. 11/933,400. (NSL-0129).
Office Action dated Feb. 25, 2009 for U.S. Appl. No. 11/361,521.
Office Action dated Jan. 29, 2009 for U.S. Appl. No. 11/361,103.
Office Action dated Jan. 29, 2009 for U.S. Appl. No. 11/361,498.
Office Action dated Jan. 7, 2009 for U.S. Appl. No. 11/290,633.
Office Action dated Jul. 15, 2008 for U.S. Appl. No. 11/361,433.
Office Action dated Jul. 29, 2008 for U.S. Appl. No. 11/362,266.
Office Action dated Jul. 31, 2008 for U.S. Appl. No. 11/933,375.
Office Action dated Jun. 10, 2009 for U.S. Appl. No. 11/395,668.
Office Action dated Jun. 11, 2008 from U.S. Appl. No. 10/836,307.
Office Action dated Jun. 15, 2009 from U.S. Appl. No. 11/395,438. (NSL-069).
Office Action dated Jun. 26, 2008 for U.S. Appl. No. 11/253,522. (NSL-044).
Office Action dated Mar. 10, 2009 U.S. Appl. No. 11/361,497.
Office Action dated Mar. 31, 2009 for U.S. Appl. No. 11/253,522. (NSL-044).
Office Action dated May 14, 2008 for U.S. Appl. No. 11/081,163. (NSL-019B).
Office Action dated May 14, 2008 from U.S. Appl. No. 11/081,163.
Padhi et al., Planarization of Copper Thin Films by Electropolishing in Phoshoric Acid for ULSI Applications, Journal of the Electrochemical Society, 2003, G10-G14, vol. 150, No. 1, Electrochemical Society Inc : USA.
Poloni et al., Liquid gallium in confined droplets under high-temperature and high-pressure conditions, Physical Review B 71. 184111 (2005).
Raffaelle et al., Electrodeposited CuInSe(2) thin film junctions, Prepared for the 1997 Fall meeting sponsored by the Materials Research Society, Dec. 1-5, 1997, Boston, MA.
Ramakrishna Reddy et al., Photoacousstic spectroscopy of sprayed CuGa(x)In(1-x)Se(2) thin films, Thin Solid Films, 2001, 205-207, vol. 387, Elsevier Science, Amsterdam : Netherlands.
Saltman and Nachtrieb, The Electrochemistry of Gallium, Journal of the Electrochemical Society, Mar. 1953, 126-130, vol. 100, No. 3, Electrochemical Society Inc. : USA.
Schnable and Javes, Electrodeposition of Molten Low-Melting Metals and Alloys from Fused-Salt Systems, Electrochemical Technology, Jul.-Aug. 1964, 201-206, Electrochemical Society, Manchester, N.H.
Schnable, Electrodeposition of Molten Metals and Alloys from Glycerine Solutions, Journal of the Electrochemical Society, Oct. 1961, 964-969, vol. 108, No. 10, Electrochemical Society Inc. : USA.

Schulz et al., Cu-In-Ga-Se Nanoparticle Colloids as Spray Deposition Precursors for Cu(in, Ga)Se(2) Solar Cell Materials, Journal of Electornic Materials, 1998, 433-437, vol. 27, No. 5, Mineral Metals & Materials Society : USA.
Schwarcz et al., TEM observations of early nucleation and growth stages in aluminum films on liquid gallium droplets, Thin Solid Films (1994), 245(1-2), 260-6.
Sedoi and Valevich. "Direct Production of Nanosized powders by the exploding wire method" Physics, Chemistry & Applications of Nanostructures (Reviews).
Sedoi et al, Generation of aerosols by the electrical explosion of wires at reduced air pressure, Aerosols, 1998, vol. 4e, No. 2, pp. 48-54.
Sedoi et al, Production of submicron aerosols by the exploding wire method, Aerosols, 1998, vol. 4e, No. 2, pp. 41-47.
Sen et al., "Preparation of Cu, Ag, Fe and Al nanoparticles by the exploding wire technique" in Proc. Indian Acad. Sci. (Chem. Sci.), vol. 115, Nos. 5 & 6, pp. 499-508, Oct.-Dec. 2003, Indian Academy of Sciences.
Subramanian and Laughlin, Binary Alloy Phase Diagrams, 2nd Edition, edited by Massalski, T.B. 1990, ASM International, Materials Park, OH, pp. 1410-1412.
Sun et al., "Monodisperse FePt Nanoparticles and Ferromagnetic FePt Nanocrystal Superlattices", Science, 287, pp. 1989-1992 (Mar. 17, 2000).
Tepper et al., "Nanosized ALumina Fibers", Advanced Materials, American Ceramic Society Bulletin, vol. 80, No. 6, Jun. 2001.
U.S. Appl. No. 10/943,658, filed on Sep. 18, 2004. (NSL-035).
U.S. Appl. No. 10/698,988, filed on Oct. 31, 2002. (NSL-014).
U.S. Appl. No. 10/782,017, filed on Feb. 19, 2004. (NSL-029).
U.S. Appl. No. 11/290,633, filed on Mar. 15, 2005, titled "Metallic Dispersion".
U.S. Appl. No. 11/396,199, filed on Mar. 30, 2006 titled "Dispersion Using Inter-metallic Materials".
U.S. Appl. No. 11/933,136, filed on Oct. 31, 2007 titled "Solution-based Fabrication of Photovoltaic Cell".
U.S. Appl. No. 11/933,255, filed on Oct. 31, 2007 titled "Solution-based Fabrication of Photovoltaic Cell".
U.S. Appl. No. 11/933,285, filed on Oct. 31, 2007 titled "Solution-based Fabrication of Photovoltaic Cell".
U.S. Appl. No. 11/933,315, filed on Oct. 31, 2007 titled "Solution-based Fabrication of Photovoltaic Cell".
U.S. Appl. No. 11/933,322, filed on Oct. 31, 2007 titled "Solution-based Fabrication of Photovoltaic Cell".
U.S. Appl. No. 11/933,338, filed on Oct. 31, 2007 titled "Solution-based Fabrication of Photovoltaic Cell".
U.S. Appl. No. 11/933,357, filed on Oct. 31, 2007 titled "Solution-based Fabrication of Photovoltaic Cell".
U.S. Appl. No. 11/933,375, filed on Oct. 31, 2007 titled "Solution-based Fabrication of Photovoltaic Cell".
U.S. Appl. No. 11/933,400, filed on Oct. 31, 2007 titled "Solution-based Fabrication of Photovoltaic Cell".
U.S. Appl. No. 11/933,407, filed on Oct. 31, 2007 titled "Solution-based Fabrication of Photovoltaic Cell".
U.S. Appl. No. 12/095,463, filed on May 29, 2008 titled "Chalcogenide Solar Cell".
Weng and Cocivera, Preparation of copper indium diselenide by selenization of copper indium oxide, Journal of Applied Physics, Aug. 1, 1993, 2046-2052, vol. 74, No. 3, American Institute of Physics, New York.
Yasuto Miyazawa and G. M. Pound, Homogeneous Nucleation of Crystalline Gallium From Liquid Gallium, Journal of Crystal Growth 23 (1974) 45-57.
Yu et al., "Heterogeneous Seed Growth: A Potentially General Synthesis of Monodisperse Metallic Nanoparticles" in J. Am. Chem. Soc. 2001, vol. 123, pp. 9198-9199.
Zhu et al., General Sonochemical Method for the Preparation of Nanophasic Selenides: Synthesis of ZnSe Nanoparticles, Chem. Mater. 2000, 12, 73-78.
Ag-GA and Cu-Ga Phase Diagrams. Nov. 1999.
Arita et al., CuInSe(2) films prepared by screen-printing and sintering method, 1988, IEEE.
B. A. Ridley et al, "All-Inorganic Field Effect Transistors Fabricated by Printing" in Science, vol. 286, pp. 746-749, Oct. 22, 1999.

Banger et al., "Synthesis and Characterization of the First Liquid Single-Source Precursors for the Deposition of Ternary Chalcopyrite (CuInS2) Thin Film Materials", Chem Matter, vol. 13, 3827-3829, 2001, American Chemical Society.

Beck, and Michael Cocivera, Thin-film copper indium diselenide prepared by selenization of copper indium oxide formed by spray pyrolysis, Thin Solid Films, 1996, 71-82, vol. 272, Elsevier Publishing Company, Amsterdam.

Berty et al., Electron diffraction study of the supercooling of very small gallium droplets, Scripta Metallurgica (1976), 10(7), 645-8.

Bosio and Windsor, Observation of a Metastability Limit in Liquid Gallium, Physical Review Letters, vol. 35, No. 24, Dec. 15, 1975.

Carmalt et al., Solid-state and solution phase metathetical synthesis of copper indium chalcogenides, Journal of Materials Chemistry, 1998, 2209-2211, vol. 8, No. 10, Roya Society of Chemistry, Great Britain.

Castro et al., "Nanocrystalline Chalcopyrite Materials (CuInS2 and CuInSe2) via Low-Temperature Pyrolsis of Molecular Single-Source Precursors" Chem Mater, vol. 15, pp. 3142-3147, 2003.

De Silva et al., Electrodeposition and characterization of CuInSe(2) for applications in thin film solar cells, Thin Solid Films, 2001, 158-163, vol. 382, Elsevier Science, Amsterdam : Netherlands.

Definition of "globule" from Oxford English Dictionary Online. 2nd edition, 1989.

Di Cicco et al., Phase transitions and undercooling in confied gallium, Philosophical Magazine B: Physics of Condensed Matter: Statistical Mechanics, Electronic, Optical and Magnetic Properties (1999), 79(Nov. 2012), 2113-2120. Publisher: Taylor & Francis Ltd.

Di Cicco, Phase Transitions in Confined Gallium Droplets, Physical Review Letters (1998), 81(14), 2942-2945, Publisher: American Physical Society.

Eberspacher et al., Improved processes for forming CuInSe(2) films, UNISUN, 1-4, Newberry Park, CA.

Eberspacher et al., Non-vacuum processing of CIGS solar cells, UNISUN, 223-224, 2001, Newbury Park, CA.

Eberspacher et al., Non-vacuum processing of CIGS solar cells, UNISUN, pp. 1-5, 2003, Newbury Park, CA.

Eberspacher et al., Non-vacuum thin-film CIGS modules, Materials Research Society Symposia Proceedings, 2003, B8.27.1-B8.27.6, vol. 763, Materials Reserach Society, Warrendale, PA.

Eberspacher et al., Thin-filme CIS alloy PV materials fabricated using non-vacuum, particles-based techniques, Thin Solid Films, 2001, 18-22, Volumer 387, Elsevier Publishing Company, Amsterdam.

Freeman et al., Ag-Clad Au Nanoparticles: Novel Aggregation, Optical, and Surface-Enhanced Raman Scattering Properties, J. Phys. Chem., vol. 100, 1996, pp. 718-724.

Granqvist and Buhrman. "Ultrafine metal particles". J. Applied Physics 47 (5): 220-2219 (1976).

Guillen and Herrero, Recrystallization and components redistribution processes in electrodeposited CuInSe(2) thin films, Thin Solid Films, 2001, 57-59, vol. 387, Elsevier Science, Amsterdam : Netherlands.

Hambrock et al. "Nano-Brass: Bimetallic Copper/Zinc Colloids by a Nonacqueous Organometallic Route using [Cu(OCH(Me)CH2NMes)2] and Et2Zn as Precursors", Chem. Mater, 15: 4217-4222, (2003).

Heyding et al., Metastable phases in gallium dispersions, Journal of Physics and Chemistry of Solids (1973), 34(1), 133-6.

Huang et al., Preparation and internal friction of nanoscale gallium droplets, Physica Status Solidi A: Applied Research (2002), 194(1), 167-172.

Iset, Inc. Website (isetinc.com/cigs.html) from Feb. 4, 2003, available from www.archive.org, 2 pages.

Kaelin et al., CIS and CIGS layers from selenized nanoparticle precursors, Thin Solid Films, 2003, 58-62, vol. 431-432, Elsevier Science, Amsterdam : Netherlands.

Kaelin et al., Electrosprayer and selenized Cu/In metal particle films, Thin Solid Films, 2004, 391-396, vol. 457, Elsevier Science, Amsterdam : Netherlands.

Kampmann et al., Juction Formation Studies of One-Step Electrodeposited CuInSe(2) on CdS, Journal of the Electrochemical Society, 1999, 150-155, vol. 146, No. 1, Royal Society of Chemistry, Great Britain.

Kapur et al., Non-Vacuum Processing of CuIn(1-x)Ga(x)Se(2) solar cells on rigid and felixble substrates using nanoparticle precursor inks, Thin Solid Films, 2003, 53-57, vol. 431-432, Elsevier Publishing Company, Amsterdam.

Karpov et al., Gallium droplet formation during MOVPE and thermal annealing of GaN, Materials Science & Engineering, B: Solid-State Materials for Advanced Technology (2001), B82(1-3), 22-24.

Kemell et al., Electrochemical Quartz Crystal Microbalance Study of the Electrodeposition Mechanisms of CuInSe(2) Thin Films, Journal of The Electrochemical Society, 2001, C110-C118, vol. 148, No. 2, Electrochemical Society: USA.

Kronik et al., "Interface redox engineering of Cu(in,Ga)Se2—based solar cells: oxygen, sodium, and chemical bath effects", Thin Solic Films, vol. 361-362, p. 353-359 (2000).

Lee et al., Fabrication of high-output-power AlGaN/GaN-based UV-light emitting diode using a Ga droplet layer, Japanese Journal of Applied Physics, Part 2: Letters (2002), 41(10A), L1037-L1039.

Li et al, "Synthesis by a Solvothermal Route and Characterization of CuInSe2 Nanowhiskers and Nanoparticles" in Advanced Materials, vol. 11, No. 17, pp. 1456-1459, 1999, Wiley-VCH Verlag GmbH.

Malik et al, "A Novel Route for the Preparation of CuSe and CuInSe2 Nanoparticles" in Advanced Materials, vol. 11, No. 17, pp. 1441-1444, Wiley-VCH Verlag GmbH, Weinheim.

Miyazawa and Pound, Homogeneous Nucleation of Crystalline Gallium from Liquid Gallium, Journal of Crystal Growth 23 (1974) 45-57.

Munoz et al., Electrodeposition of Indium onto Vitreous Carbon from Acid Chloride Solutions, Journal of the Electrochemical Society, 1999, 2123-2130, vol. 146, No. 6, Electrochemical Society Inc.: USA.

Norsworthy et al., CIS film growth by metallic ink coating and selenization, Solar Energy Materials & Solar Cells, 2000, 127-134, vol. 60, Elsevier Science, Amsterdam : Netherlands.

Notice of Allowance and Fees dated Aug. 31, 2011 for U.S. Appl. No. 11/933,400. (NSL-0129).

Notice of Allowance and Fees due dated Feb. 9, 2009 for U.S. Appl. No. 11/081,163. (NSL-019B).

Notice of Allowance and Fees due dated Jul. 11, 2008 for U.S. Appl. No. 10/782,017. (NSL-029).

Notice of Allowance and Fees Due dated Jul. 25, 2007 for U.S. Appl. No. 10/943,657. (NSL-033).

Notice of Allowance and Fees due dated Jun. 11, 2009 for U.S. Appl. No. 11/081,163. (NSL-019B).

Notice of Allowance and Fees due dated Mar. 20, 2009 for U.S. Appl. No. 10/782,017. (NSL-029).

Notice of Allowance and Fees due dated Sep. 18, 2009 for U.S. Appl. No. 10/782,017. (NSL-029).

Office Action dated Apr. 1, 2009 for U.S. Appl. No. 11/933,400. (NSL-0129).

Office Action dated Apr. 5, 2007 for U.S. Appl. No. 10/836,307.

Office Action dated Apr. 10, 2009 for U.S. Appl. No. 11/362,266.

Office Action dated Apr. 14, 2011 for U.S. Appl. No. 11/933,400. (NSL-0129).

Office Action dated Aug. 22, 2011 for U.S. Appl. No. 11/933,357. (NSL-0126).

* cited by examiner

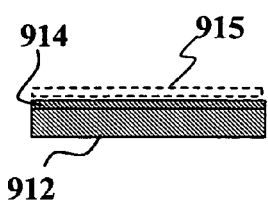
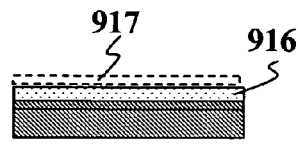
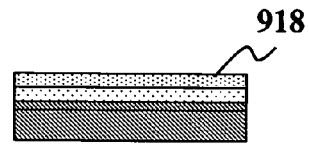
FIG. 8A  FIG. 8B  FIG. 8C
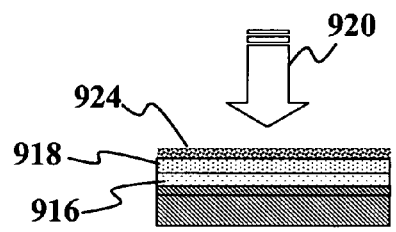
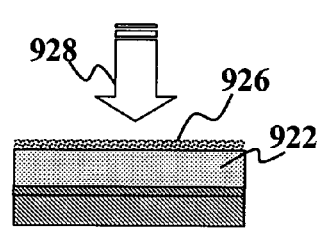
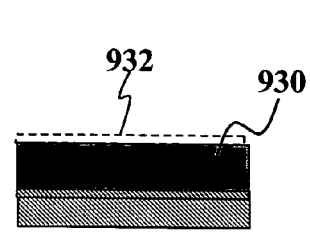
FIG. 8D  FIG. 8E  FIG. 8F
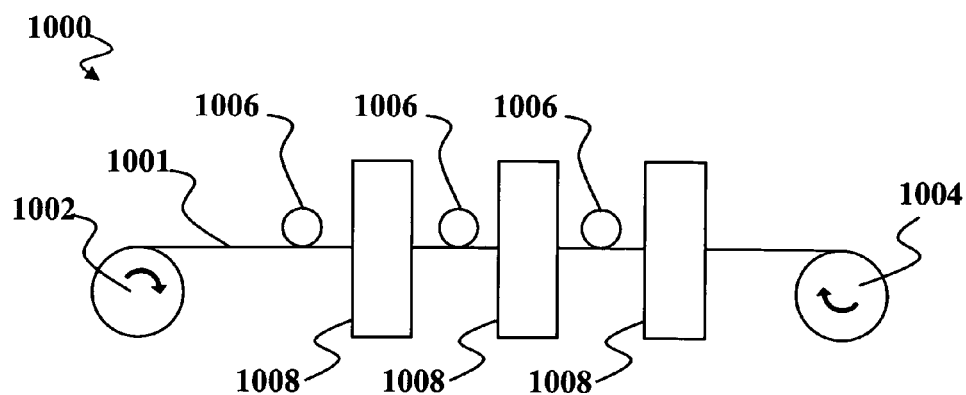
FIG. 9

HIGH-THROUGHPUT PRINTING OF SEMICONDUCTOR PRECURSOR LAYER BY USE OF CHALCOGEN-CONTAINING VAPOR AND INTER-METALLIC MATERIAL

CROSS-REFERENCE TO RELATED APPLICATION

This application is a continuation-in-part of commonly-assigned, application Ser. No. 11/361,522 entitled "HIGH-THROUGHPUT PRINTING OF CHALCOGEN LAYER" filed Feb. 23, 2006, now abandoned which is a continuation-in-part of commonly-assigned, application Ser. No. 11/290,633 entitled "CHALCOGENIDE SOLAR CELLS" filed Nov. 29, 2005 now U.S. Pat. No. 8,048,477 and Ser. No. 10/782,017, entitled "SOLUTION-BASED FABRICATION OF PHOTOVOLTAIC CELL" filed Feb. 19, 2004 now U.S. Pat. No. 7,663,057 and published as U.S. patent application publication 20050183767. This application is also a continuation-in-part of commonly-assigned, U.S. patent application Ser. No. 10/943,657, entitled "COATED NANOPARTICLES AND QUANTUM DOTS FOR SOLUTION-BASED FABRICATION OF PHOTOVOLTAIC CELLS" filed Sep. 18, 2004 now U.S. Pat. No. 7,306,823. This application is a also continuation-in-part of commonly-assigned, U.S. patent application Ser. No. 11/081,163, entitled "METALLIC DISPERSION", filed Mar. 16, 2005 now U.S. Pat. No. 7,604,843. This application is also continuation-in-part of commonly-assigned, co-pending U.S. patent application Ser. No. 10/943,685, entitled "FORMATION OF CIGS ABSORBER LAYERS ON FOIL SUBSTRATES", filed Sep. 18, 2004. This application is a continuation-in-part of commonly-assigned, application Ser. No. 11/361,464 entitled "HIGH-THROUGHPUT PRINTING OF SEMICONDUCTOR PRECURSOR LAYER BY USE OF CHALCOGEN-CONTAINING VAPOR" filed Feb. 23, 2006 now abandoned. All of the above applications are fully incorporated herein by reference for all purposes.

FIELD OF THE INVENTION

This invention relates to semiconductor thin films and more specifically to fabrication of solar cells that use active layers based on IB-IIIA-VIA compounds.

BACKGROUND OF THE INVENTION

Solar cells and solar modules convert sunlight into electricity. These electronic devices have been traditionally fabricated using silicon (Si) as a light-absorbing, semiconducting material in a relatively expensive production process. To make solar cells more economically viable, solar cell device architectures have been developed that can inexpensively make use of thin-film, light-absorbing semiconductor materials such as copper-indium-gallium-sulfo-di-selenide, $Cu(In, Ga)(S, Se)_2$, also termed CI(G)S(S). This class of solar cells typically has a p-type absorber layer sandwiched between a back electrode layer and an n-type junction partner layer. The back electrode layer is often Mo, while the junction partner is often CdS. A transparent conductive oxide (TCO) such as zinc oxide ($ZnO_x$) is formed on the junction partner layer and is typically used as a transparent electrode. CIS-based solar cells have been demonstrated to have power conversion efficiencies exceeding 19%.

A central challenge in cost-effectively constructing a large-area CIGS-based solar cell or module is that the elements of the CIGS layer must be within a narrow stoichiometric ratio on nano-, meso-, and macroscopic length scale in all three dimensions in order for the resulting cell or module to be highly efficient. Achieving precise stoichiometric composition over relatively large substrate areas is, however, difficult using traditional vacuum-based deposition processes. For example, it is difficult to deposit compounds and/or alloys containing more than one element by sputtering or evaporation. Both techniques rely on deposition approaches that are limited to line-of-sight and limited-area sources, tending to result in poor surface coverage. Line-of-sight trajectories and limited-area sources can result in non-uniform distribution of the elements in all three dimensions and/or poor film-thickness uniformity over large areas. These non-uniformities can occur over the nano-, meso-, and/or macroscopic scales. Such non-uniformity also alters the local stoichiometric ratios of the absorber layer, decreasing the potential power conversion efficiency of the complete cell or module.

Alternatives to traditional vacuum-based deposition techniques have been developed. In particular, production of solar cells on flexible substrates using non-vacuum, semiconductor printing technologies provides a highly cost-efficient alternative to conventional vacuum-deposited solar cells. For example, T. Arita and coworkers [20th IEEE PV Specialists Conference, 1988, page 1650] described a non-vacuum, screen printing technique that involved mixing and milling pure Cu, In and Se powders in the compositional ratio of 1:1:2 and forming a screen printable paste, screen printing the paste on a substrate, and sintering this film to form the compound layer. They reported that although they had started with elemental Cu, In and Se powders, after the milling step the paste contained the $CuInSe_2$ phase. However, solar cells fabricated from the sintered layers had very low efficiencies because the structural and electronic quality of these absorbers was poor.

Screen-printed $CuInSe_2$ deposited in a thin-film was also reported by A. Vervaet et al. [9th European Communities PV Solar Energy Conference, 1989, page 480], where a micron-sized $CuInSe_2$ powder was used along with micron-sized Se powder to prepare a screen printable paste. Layers formed by non-vacuum, screen printing were sintered at high temperature. A difficulty in this approach was finding an appropriate fluxing agent for dense $CuInSe_2$ film formation. Even though solar cells made in this manner had poor conversion efficiencies, the use of printing and other non-vacuum techniques to create solar cells remains promising.

Others have tried using chalcogenide powders as precursor material, e.g. micron-sized CIS powders deposited via screen-printing, amorphous quarternary selenide nanopowder or a mixture of amorphous binary selenide nanopowders deposited via spraying on a hot substrate, and other examples [(1) Vervaet, A. et al., E. C. Photovoltaic Sol. Energy Conf, Proc. Int. Conf, 10th (1991), 900-3.; (2) Journal of Electronic Materials, Vol. 27, No. 5, 1998, p. 433; Ginley et al.; (3) WO 99,378,32; Ginley et al.; (4) U.S. Pat. No. 6,126,740]. So far, no promising results have been obtained when using chalcogenide powders for fast processing to form CIGS thin-films suitable for solar cells.

Due to high temperatures and/or long processing times required for sintering, formation of a IB-IIIA-chalcogenide compound film suitable for thin-film solar cells is challenging when starting from IB-IIIA-chalcogenide powders where each individual particle contains appreciable amounts of all IB, IIIA, and VIA elements involved, typically close to the stoichiometry of the final IB-IIIA-chalcogenide compound film. In particular, due to the limited contact area between the solid powders in the layer and the high melting points of these ternary and quarternary materials, sintering of such deposited layers of powders either at high temperatures or for extremely long times provides ample energy and time for phase separation, leading to poor compositional and thickness uniformity of the CIGS absorber layer at multiple spatial scales. Poor uniformity was evident by a wide range of heterogeneous layer features, including but not limited to porous layer structure, voids, gaps, thin spots, local thick regions, cracking, and regions of relatively low-density. This non-uniformity is exacerbated by the complicated sequence of phase transformations undergone during the formation of CIGS crystals from precursor materials. In particular, multiple phases forming in discrete areas of the nascent absorber film will also lead to increased non-uniformity and ultimately poor device performance.

The requirement for fast processing then leads to the use of high temperatures, which would damage temperature-sensitive foils used in roll-to-roll processing. Indeed, temperature-sensitive substrates limit the maximum temperature that can be used for processing a precursor layer into CIS or CIGS to a level that is typically well below the melting point of the ternary or quarternary selenide (>900° C.). A fast and high-temperature process, therefore, is less preferred. Both time and temperature restrictions, therefore, have not yet resulted in promising results on suitable substrates using multinary selenides as starting materials.

As an alternative, starting materials may be based on a mixture of binary selenides, which at a temperature above 500° C. or lower would result in the formation of a liquid phase that would enlarge the contact area between the initially solid powders and, thereby, accelerate the sintering process as compared to an all-solid process. Unfortunately, for most binary selenide compositions, below 500° C. hardly any liquid phase is created.

Thus, there is a need in the art, for a rapid yet low-temperature technique for fabricating high-quality and uniform CIGS films for solar modules and suitable precursor materials for fabricating such films.

SUMMARY OF THE INVENTION

The disadvantages associated with the prior art are overcome by embodiments of the present invention directed to the introduction of IB and IIIA elements in the form of chalcogenide nanopowders and combining these chalcogenide nanopowders with an additional source of chalcogen such as selenium or sulfur, tellurium or a mixture of two or more of these, to form a group IB-IIIA-chalcogenide compound. According to one embodiment a compound film may be formed from a mixture of binary selenides, sulfides, or tellurides and selenium, sulfur or tellurium. According to another embodiment, the compound film may be formed using core-shell nanoparticles having core nanoparticles containing group IB and/or group IIIA elements coated with a non-oxygen chalcogen material.

In one embodiment of the present invention, the method comprises forming a precursor material comprising group IB and/or group IIIA particles of any shape. The method may include forming a precursor layer of the precursor material over a surface of a substrate. The method may further include heating the particle precursor material in a substantially oxygen-free chalcogen atmosphere to a processing temperature sufficient to react the particles and to release chalcogen from the chalcogenide particles, wherein the chalcogen assumes a liquid form and acts as a flux to improve intermixing of elements to form a group IB-IIIA-chalcogenide film at a desired stoichiometric ratio. The chalcogen atmosphere may provide a partial pressure greater than or equal to the vapor pressure of liquid chalcogen in the precursor layer at the processing temperature.

In one embodiment of the present invention, the method comprises forming a precursor material comprising group IB and/or group IIIA and/or group VIA particles of any shape. The method may include forming a precursor layer of the precursor material over a surface of a substrate. The method may further include heating the particle precursor material in a substantially oxygen-free chalcogen atmosphere to a processing temperature sufficient to react the particles and to release chalcogen from the chalcogenide particles, wherein the chalcogen assumes a liquid form and acts as a flux to improve intermixing of elements to form a group IB-IIIA-chalcogenide film at a desired stoichiometric ratio. The suitable atmosphere may be a selenium atmosphere. The suitable atmosphere may comprise of a selenium atmosphere providing a partial pressure greater than or equal to vapor pressure of selenium in the precursor layer. The suitable atmosphere may comprise of a non-oxygen atmosphere containing chalcogen vapor at a partial pressure of the chalcogen greater than or equal to a vapor pressure of the chalcogen at the processing temperature and processing pressure to minimize loss of chalcogen from the precursor layer, wherein the processing pressure is a non-vacuum pressure. The suitable atmosphere may comprises of a non-oxygen atmosphere containing chalcogen vapor at a partial pressure of the chalcogen greater than or equal to a vapor pressure of the chalcogen at the processing temperature and processing pressure to minimize loss of chalcogen from the precursor layer, wherein the processing pressure is a non-vacuum pressure and wherein the particles are one or more types of binary chalcogenides.

In one embodiment of the present invention, the method comprises forming a precursor material comprising group IB-chalcogenide and/or group IIIA-chalcogenide particles, wherein an overall amount of chalcogen in the particles relative to an overall amount of chalcogen in a group IB-IIIA-chalcogenide film created from the precursor material, is at a ratio that provides an excess amount of chalcogen in the precursor material. The method also includes using the precursor material to form a precursor layer over a surface of a substrate. The particle precursor material is heated in a suitable atmosphere to a temperature sufficient to melt the particles and to release at least the excess amount of chalcogen from the chalcogenide particles, wherein the excess amount of chalcogen assumes a liquid form and acts as a flux to improve intermixing of elements to form the group IB-IIIA-chalcogenide film at a desired stoichiometric ratio. The overall amount of chalcogen in the precursor material is an amount greater than or equal to a stoichiometric amount found in the IB-IIIA-chalcogenide film.

It should be understood that, optionally, the overall amount of chalcogen may be greater than a minimum amount necessary to form the final IB-IIIA-chalcogenide at the desired stoichiometric ratio. The overall amount of chalcogen in the precursor material may be an amount greater than or equal to the sum of: 1) the stoichiometric amount found in the IB-IIIA-chalcogenide film and 2) a minimum amount of chalcogen necessary to account for chalcogen lost during processing to form the group IB-IIIA-chalcogenide film having the desired stoichiometric ratio. Optionally, the overall amount may be about 2 times greater than a minimum amount necessary to form the IB-IIIA-chalcogenide film at the desired stoichiometric ratio. The particles may be chalcogen-rich particles and/or selenium-rich particles and/or sulfur-rich particles and/or tellurium-rich particles. In one embodiment, the overall amount of chalcogen in the group IB-chalcogenide particles is greater than an overall amount of chalcogen in the group IIIA particles. The overall amount of chalcogen in the group IB-chalcogenide particles may be less than an overall amount of chalcogen in the group IIIA particles.

Optionally, the group IB-chalcogenide particles may include a mix of particles, wherein some particles are chalcogen-rich and some are not, and wherein the chalcogen-rich particles outnumber the particles that are not. The group IIIA-chalcogenide particles may include a mix of particles, wherein some particles are chalcogen-rich and some are not, and wherein the chalcogen-rich particles outnumber the particles that are not. The particles may be IBxVIAy and/or IIIAaVIAb particles, wherein x<y and a<b. The resulting group IB-IIIA-chalcogenide film may be CuzIn(1−x)GaxSe2, wherein $0.5 \leq z \leq 1.5$ and $0 \leq x \leq 1$. The amount of chalcogen in the particles may be above the stoichiometric ratio required to form the film. The particles may be substantially oxygen-free particles. The particles may be particles that do not contain oxygen above about 5.0 weight-percentage. The group IB element may be copper. The group IIIA element may be comprised of gallium and/or indium and/or aluminum. The chalcogen may be selenium or sulfur or tellurium. The particles may be alloy particles. The particles may be binary alloy particles and/or ternary alloy particles and/or multi-nary alloy particles and/or compound particles and/or solid-solution particles.

Optionally, the precursor material may include group IB-chalcogenide particles containing a chalcogenide material in the form of an alloy of a chalcogen and an element of group IB and/or wherein the particle precursor material includes group IIIA-chalcogenide particles containing a chalcogenide material in the form of an alloy of a chalcogen and one or more elements of group IIIA. The group IB-chalcogenide may be comprised of CGS and the group IIIA-chalcogenide may be comprised of CIS. The method may include adding an additional source of chalcogen prior to heating the precursor material. The method may include adding an additional source of chalcogen during heating of the precursor material. The method may further include adding an additional source of chalcogen before, simultaneously with, or after forming the precursor layer. The method may include adding an additional source of chalcogen by forming a layer of the additional source over the precursor layer. The method may include adding an additional source of chalcogen on the substrate prior to forming the precursor layer. A vacuum-based process may be used to add an additional source of chalcogen in contact with the precursor layer. The amounts of the group IB element and amounts of chalcogen in the particles may be selected to be at a stoichiometric ratio for the group IB chalcogenide that provides a melting temperature less than a highest melting temperature found on a phase diagram for any stoichiometric ratio of elements for the group IB chalcogenide. The method may include using a source of extra chalcogen that includes particles of an elemental chalcogen. The extra source of chalcogen may be a chalcogenide. The amounts of the group IIIA element and amounts of chalcogen in the particles may be selected to be at a stoichiometric ratio for the group IIIA chalcogenide that provides a melting temperature less than a highest melting temperature found on a phase diagram for any stoichiometric ratio of elements for the group IIIA chalcogenide.

Optionally, the group IB-chalcogenide particles may be CuxSey, wherein the values for x and y are selected to create a material with a reduced melting temperature as determined by reference to the highest melting temperature on a phase diagram for Cu—Se. The group IB-chalcogenide particles may be CuxSey, wherein x is in the range of about 2 to about 1 and y is in the range of about 1 to about 2. The group IIIA-chalcogenide particles may be InxSey, wherein the values for x and y are selected to create a material with a reduced melting temperature as determined by reference to the highest melting temperature on a phase diagram for In—Se. The group IIIA-chalcogenide particles may be InxSey, wherein x is in the range of about 1 to about 6 and y is in the range of about 0 to about 7. The group IIIA-chalcogenide particles may be GaxSey, wherein the values for x and y are selected to create a material with a reduced melting temperature as determined by reference to the highest melting temperature on a phase diagram for Ga—Se. The group IIIA-chalcogenide particles may be GaxSey, wherein x is in the range of about 1 to about 2 and y is in the range of about 1 to about 3. The melting temperature may be at a eutectic temperature for the material as indicated on the phase diagram. The group IB or IIIA chalcogenide may have a stoichiometric ratio that results in the group IB or IIIA chalcogenide being less thermodynamically stable than the group IB-IIIA-chalcogenide compound.

In yet another embodiment of the present invention, the method may further include forming at least a second layer of a second precursor material over the precursor layer, wherein the second precursor material comprises group IB-chalcogenide and/or group IIIA-chalcogenide particles and wherein the second precursor material has particles with a different IB-to-chalcogen ratio and/or particles with a different IIIA-to-chalcogen ratio than the particles of the precursor material of the first precursor layer. The group IB-chalcogenide in the first precursor layer may be comprised of CuxSey and the group IB-chalcogenide in the second precursor layer comprises CuzSey, wherein x>z. Optionally, the C/I/G ratios may be the same for each layer and only the chalcogen amount varies. The method may include depositing a thin group IB-IIIA chalcogenide layer on the substrate to serve as a nucleation plane for film growth from the precursor layer which is deposited on top of the thin group IB-IIIA chalcogenide layer. A planar nucleation layer of a group IB-IIIA chalcogenide may be deposited prior to forming the precursor layer. The method may include depositing a thin CIGS layer on the substrate to serve as a nucleation field for CIGS growth from the precursor layer which is printed on top of the thin CIGS layer.

In yet another embodiment of the present invention, the film is formed from a precursor layer of the particles and a layer of a sodium containing material in contact with the precursor layer. Optionally, the film is formed from a precursor layer of the particles and a layer in contact with the precursor layer and containing at least one of the following materials: a group IB element, a group IIIA element, a group VIA element, a group IA element, a binary and/or multinary alloy of any of the preceding elements, a solid solution of any of the preceding elements, copper, indium, gallium, selenium, copper indium, copper gallium, indium gallium, sodium, a sodium compound, sodium fluoride, sodium indium sulfide, copper selenide, copper sulfide, indium selenide, indium sulfide, gallium selenide, gallium sulfide, copper indium selenide, copper indium sulfide, copper gallium selenide, copper gallium sulfide, indium gallium selenide, indium gallium sulfide, copper indium gallium selenide, and/or copper indium gallium sulfide. The particles may contain sodium. Optionally, the particles may be doped to contain sodium at about 1 at % or less. The particles may contain at least one of the following materials: Cu—Na, In—Na, Ga—Na, Cu—In—Na, Cu—In—Ga—Na, Cu—Ga—Na, In—Ga—Na, Na—Se, Cu—Se—Na, In—Se—Na, Ga—Se—Na, Cu—In—Se—Na, Cu—Ga—

Se—Na, In—Ga—Se—Na, Cu—In—Ga—Se—Na, Na—S, Cu—S—Na, In—S—Na, Ga—S—Na, Cu—In—S—Na, Cu—Ga—S—Na, In—Ga—S—Na, or Cu—In—Ga—S—Na The film may be formed from a precursor layer of the particles and an ink containing a sodium compound with an organic counter-ion or a sodium compound with an inorganic counter-ion. Optionally, the film may be formed from a precursor layer of the particles and a layer of a sodium containing material in contact with the precursor layer and/or particles containing at least one of the following materials: Cu—Na, In—Na, Ga—Na, Cu—In—Na, Cu—Ga—Na, In—Ga—Na, Na—Se, Cu—Se—Na, In—Se—Na, Ga—Se—Na, Cu—In—Se—Na, Cu—In—Ga—Na, Cu—Ga—Se—Na, In—Ga—Se—Na, Cu—In—Ga—Se—Na, Na—S, Cu—S—Na, In—S—Na, Ga—S—Na, Cu—In—S—Na, Cu—Ga—S—Na, In—Ga—S—Na, or Cu—In—Ga—S—Na; and/or an ink containing the particles and a sodium compound with an organic counter-ion or a sodium compound with an inorganic counter-ion. The method may also include adding a sodium containing material to the film after the processing step.

In yet another embodiment of the present invention, a precursor material is provided that is comprised of group IB-chalcogenide particles containing a substantially oxygen-free chalcogenide material in the form of an alloy of a chalcogen with an element of group IB; and/or group IIIA-chalcogenide particles containing a substantially oxygen-free chalcogenide material in the form of an alloy of a chalcogen with one or more elements of group IIIA. The group IB-chalcogenide particles and/or the group IIIA-chalcogenide particles may have a stoichiometric ratio that provides a source of surplus chalcogen, wherein the overall amount of chalcogen in the precursor material is an amount greater than or equal to a stoichiometric amount found in the IB-IIIA-chalcogenide film. The overall amount of chalcogen in the precursor material is an amount greater than or equal to the sum of: 1) the stoichiometric amount found in the IB-IIIA-chalcogenide film and 2) a minimum amount of chalcogen necessary to account for chalcogen lost during processing to form the group IB-IIIA-chalcogenide film having the desired stoichiometric ratio. The overall amount may be greater than a minimum amount necessary to form the IB-IIIA-chalcogenide film at the desired stoichiometric ratio. The overall amount may be about 2 times greater than a minimum amount necessary to form the IB-IIIA-chalcogenide film at the desired stoichiometric ratio.

In another embodiment, a liquid ink may be made using one or more liquid metals. For example, an ink may be made starting with a liquid and/or molten mixture of Gallium and/or Indium. Copper nanoparticles may then be added to the mixture, which may then be used as the ink/paste. Copper nanoparticles are available commercially. Alternatively, the temperature of the Cu—Ga—In mixture may be adjusted (e.g. cooled) until a solid forms. The solid may be ground at that temperature until small nanoparticles (e.g., less than 5 nm) are present. Selenium may be added to the ink and/or a film formed from the ink by exposure to selenium vapor, e.g., before, during, or after annealing.

In yet another embodiment of the present invention, a process is described comprising of formulating a dispersion of solid and/or liquid particles comprising group IB and/or IIIA elements, and, optionally, at least one group VIA element. The process includes depositing the dispersion onto a substrate to form a layer on the substrate and reacting the layer in a suitable atmosphere to form a film. In this process, at least one set of the particles are inter-metallic particles containing at least one group IB-IIIA inter-metallic phase.

For any of the foregoing embodiments, it should be understood that the particles may contain an inter-metallic phase and is not limited to only group IB-IIIA phases.

In yet another embodiment of the present invention, a composition is provided comprised of a plurality of particles comprising group IB and/or IIIA elements, and, optionally, at least one group VIA element. At least one set of the particles contains at least one group IB-IIIA inter-metallic alloy phase.

In a still further embodiment of the present invention, the method may include formulating a dispersion of particles comprising group IB and/or IIIA elements, and, optionally, at least one group VIA element. The method may include depositing the dispersion onto a substrate to form a layer on the substrate and reacting the layer in a suitable atmosphere to form a film. At least one set of the particles contain a group IB-poor, group IB-IIIA alloy phase. In some embodiments, group IB-poor particles contribute less than about 50 molar percent of group IB elements found in all of the particles. The group IB-poor, group IB-IIIA alloy phase particles may be a sole source of one of the group IIIA elements. The group IB-poor, group IB-IIIA alloy phase particles may contain an inter-metallic phase and may be a sole source of one of the group IIIA elements. The group IB-poor, group IB-IIIA alloy phase particles may contain an inter-metallic phase and are a sole source of one of the group IIIA elements. The group IB-poor, group IB-IIIA alloy phase particles may be $Cu_1In_2$ particles and are a sole source of indium in the material.

It should be understood that for any of the foregoing the film and/or final compound may include a group IB-IIIA-VIA compound. The reacting step may comprise of heating the layer in the suitable atmosphere. The depositing step may include coating the substrate with the dispersion. At least one set of the particles in the dispersion may be in the form of nanoglobules. At least one set of the particles in the dispersion may be in the form of nanoglobules and contain at least one group IIIA element. At least one set of the particles in the dispersion may be in the form of nanoglobules comprising of a group IIIA element in elemental form. In some embodiments of the present invention, the inter-metallic phase is not a terminal solid solution phase. In some embodiments of the present invention, the inter-metallic phase is not a solid solution phase. The inter-metallic particles may contribute less than about 50 molar percent of group IB elements found in all of the particles. The inter-metallic particles may contribute less than about 50 molar percent of group IIIA elements found in all of the particles. The inter-metallic particles may contribute less than about 50 molar percent of the group IB elements and less than about 50 molar percent of the group IIIA elements in the dispersion deposited on the substrate. The inter-metallic particles may contribute less than about 50 molar percent of the group IB elements and more than about 50 molar percent of the group IIIA elements in the dispersion deposited on the substrate. The inter-metallic particles may contribute more than about 50 molar percent of the group IB elements and less than about 50 molar percent of the group IIIA elements in the dispersion deposited on the substrate. The molar percent for any of the foregoing may be based on a total molar mass of the elements in all particles present in the dispersion. In some embodiments, at least some of the particles have a platelet shape. In some embodiments, a majority of the particles have a platelet shape. In other embodiments, substantially all of the particles have a platelet shape.

For any of the foregoing embodiments, an inter-metallic material for use with the present invention is a binary material. The inter-metallic material may be a ternary material. The inter-metallic material may comprise of $Cu_1In_2$. The inter-metallic material may be comprised of a composition in a δ phase of $Cu_1In_2$. The inter-metallic material may be comprised of a composition in between a δ phase of $Cu_1In_2$ and a phase defined by $Cu16In9$. The inter-metallic material may be comprised of $Cu_1Ga_2$. The inter-metallic material may be comprised of an intermediate solid-solution of $Cu_1Ga_2$. The inter-metallic material may be comprised of $Cu_{68}Ga_{38}$. The inter-metallic material may be comprised of $Cu_{70}Ga_{30}$. The inter-metallic material may be comprised of $Cu_{75}Ga_{25}$. The inter-metallic material may be comprised of a composition of Cu—Ga of a phase in between the terminal solid-solution and an intermediate solid-solution next to it. The inter-metallic may be comprised of a composition of Cu—Ga in a γ1 phase (about 31.8 to about 39.8 wt % Ga). The inter-metallic may be comprised of a composition of Cu—Ga in a γ2 phase (about 36.0 to about 39.9 wt % Ga). The inter-metallic may be comprised of a composition of Cu—Ga in a γ3 phase (about 39.7 to about –44.9 wt % Ga). The inter-metallic may be comprised of a composition of Cu—Ga in a phase between γ2 and γ3. The inter-metallic may be comprised of a composition of Cu—Ga in a phase between the terminal solid solution and γ1. The inter-metallic may be comprised of a composition of Cu—Ga in a θ phase (about 66.7 to about 68.7 wt % Ga). The inter-metallic material may be comprised of Cu-rich Cu—Ga. Gallium may be incorporated as a group IIIA element in the form of a suspension of nanoglobules. Nanoglobules of gallium may be formed by creating an emulsion of liquid gallium in a solution. Gallium nanoglobules may be created by being quenched below room temperature.

A process according to the any of the foregoing embodiments of the present invention may include maintaining or enhancing a dispersion of liquid gallium in solution by stirring, mechanical means, electromagnetic means, ultrasonic means, and/or the addition of dispersants and/or emulsifiers. The process may include adding a mixture of one or more elemental particles selected from: aluminum, tellurium, or sulfur. The suitable atmosphere may contain selenium, sulfur, tellurium, $H_2$, CO, $H_2Se$, $H_2S$, Ar, $N_2$ or combinations or mixture thereof. The suitable atmosphere may contain at least one of the following: $H_2$, CO, Ar, and $N_2$. One or more classes of the particles may be doped with one or more inorganic materials. Optionally, one or more classes of the particles are doped with one or more inorganic materials chosen from the group of aluminum (Al), sulfur (S), sodium (Na), potassium (K), or lithium (Li).

Optionally, embodiments of the present invention may include having a copper source that does not immediately alloy with In, and/or Ga. One option would be to use (slightly) oxidized copper. The other option would be to use CuxSey. Note that for the (slightly) oxidized copper approach, a reducing step may be desired. Basically, if elemental copper is used in liquid In and/or Ga, speed of the process between ink preparation and coating should be sufficient so that the particles have not grown to a size that will result in thickness non-uniform coatings.

It should be understood that the temperature range may that of the substrate only since that is typically the only one that should not be heated above its melting point. This holds for the lowest melting material in the substrate, being Al and other suitable substrates.

A further understanding of the nature and advantages of the invention will become apparent by reference to the remaining portions of the specification and drawings.

BRIEF DESCRIPTION OF THE DRAWINGS

FIGS. 8A-8F shows the use of a chemical gradient according to one embodiment of the present invention.

FIG. 9 shows a roll-to-roll system according to the present invention.

DESCRIPTION OF THE SPECIFIC EMBODIMENTS

Figure 1A:
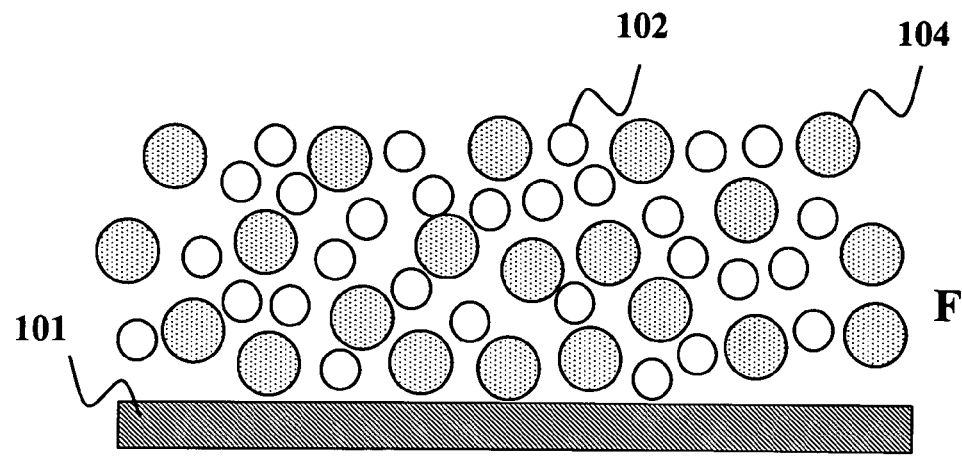
FIGS. 1A-1C are a sequence of schematic diagrams illustrating the formation of chalcogenide film from binary nanoparticles and chalcogen particles according to an embodiment of the present invention.

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for a barrier film, this means that the barrier film feature may or may not be present, and, thus, the description includes both structures wherein a device possesses the barrier film feature and structures wherein the barrier film feature is not present.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Embodiments of the present invention take advantage of the chemistry and phase behavior of mixtures of group IB, IIIA and chalcogen materials. When forming IB-IIIA-VIA compounds such as CuIn(Se,S) compounds starting from precursors containing a mixture of these elements the mixture goes through a complicated sequence of phases before forming the final compound. It is noted that for several different routes to form these IB-IIIA-VIA compounds just before forming the desired CuIn(Se,S) compound the mixture passes through one or more stages of multinary phases where the binary alloys copper chalcogenide, indium chalcogenide, gallium chalcogenide and the chalcogen are present. In addition, it is noted that a disadvantage of prior techniques is that they either tended to produce a small contact area between the chalcogen (e.g., Se or S) and the other elements or not used a separate source of chalcogen at all.

To overcome these drawbacks a solution is proposed wherein the precursor material contains binary chalcogenide nanopowders, e.g., copper selenide, and/or indium selenide and/or gallium selenide and/or a source of extra chalcogen, e.g., Se or S nanoparticles less than about 200 nanometers in size. If the chalcogen melts at a relatively low temperature (e.g., 220° C. for Se, 120° C. for S) the chalcogen is already in a liquid state and makes good contact with the nanoparticles. If the nanoparticles and chalcogen are then heated sufficiently (e.g., at about 375° C.) the chalcogen reacts with the chalcogenides to form the desired IB-IIIA-chalcogenide material.

It should also be understood that group IB, IIIA, and VIA elements other than Cu, In, Ga, Se, and S may be included in the description of the IB-IIIA-VIA alloys described herein, and that the use of a hyphen ("-" e.g., in Cu—Se or Cu—In—Se) does not indicate a compound, but rather indicates a coexisting mixture of the elements joined by the hyphen. Where several elements can be combined with or substituted for each other, such as In and Ga, or Se, and S, in embodiments of the present invention, it is not uncommon in this art to include in a set of parentheses those elements that can be combined or interchanged, such as (In, Ga) or (Se, S). The descriptions in this specification sometimes use this convenience. Finally, also for convenience, the elements are discussed with their commonly accepted chemical symbols. Group IB elements suitable for use in the method of this invention include copper (Cu), silver (Ag), and gold (Au). Preferably the group IB element is copper (Cu). Group IIIA elements suitable for use in the method of this invention include gallium (Ga), indium (In), aluminum (Al), and thallium (Tl). Preferably the group IIIA element is gallium (Ga) and/or indium (In). Group VIA elements of interest include selenium (Se), sulfur (S), and tellurium (Te), and preferably the group VIA element is either Se and/or S. The resulting group IB-IIIA-VIA compound is preferably a compound of Cu, In, Ga and selenium (Se) or sulfur S of the form $CuIn_{(1-x)}Ga_xS_{2(1-y)}Se_{2y}$, where $0 \leq x \leq 1$ and $0 \leq y \leq 1$. It should also be understood that the resulting group IB-IIIA-VIA compound may be a compound of Cu, In, Ga and selenium (Se) or sulfur S of the form $Cu_zIn_{(1-x)}Ga_xS_{2(1-y)}Se_{2y}$, where $0.5 \leq z \leq 1.5$, $0 \leq x \leq 1.0$ and $0 \leq y \leq 1.0$.

An alternative way to take advantage of the low melting points of chalcogens such as Se and S is to form core-shell nanoparticles in which the core is an elemental or binary nanoparticle and the shell is a chalcogen coating. The chalcogen melts and quickly reacts with the material of the core nanoparticles.

Formation of Group IB-IIIA-VIA non-oxide nanopowders is described in detail, e.g., in US Patent Application publication 20050183767 entitled "Solution-based fabrication of photovoltaic cell" which has been incorporated herein by reference.

According to an embodiment of the invention, a film of a group IB-IIIA-chalcogenide compound is formed on a substrate 101 from binary alloy chalcogenide nanoparticles 102 and a source of extra chalcogen, e.g., in the form of a powder containing chalcogen particles 104 as shown in FIG. 1A. The binary alloy chalcogenide nanoparticles 102 include group IB-binary chalcogenide nanoparticles (e.g. group IB non-oxide chalcogenides, such as CuSe, CuS or CuTe) and/or group IIIA-chalcogenide nanoparticles (e.g., group IIIA non-oxide chalcogenides, such as Ga(Se, S, Te), In(Se, S, Te) and Al(Se, S, Te). The binary chalcogenide nanoparticles 102 may be less than about 500 nm in size, preferably less than about 200 nm in size. The chalcogen particles may be micron- or submicron-sized non-oxygen chalcogen (e.g., Se, S or Te) particles, e.g., a few hundred nanometers or less to a few microns in size.

Figure 1B:
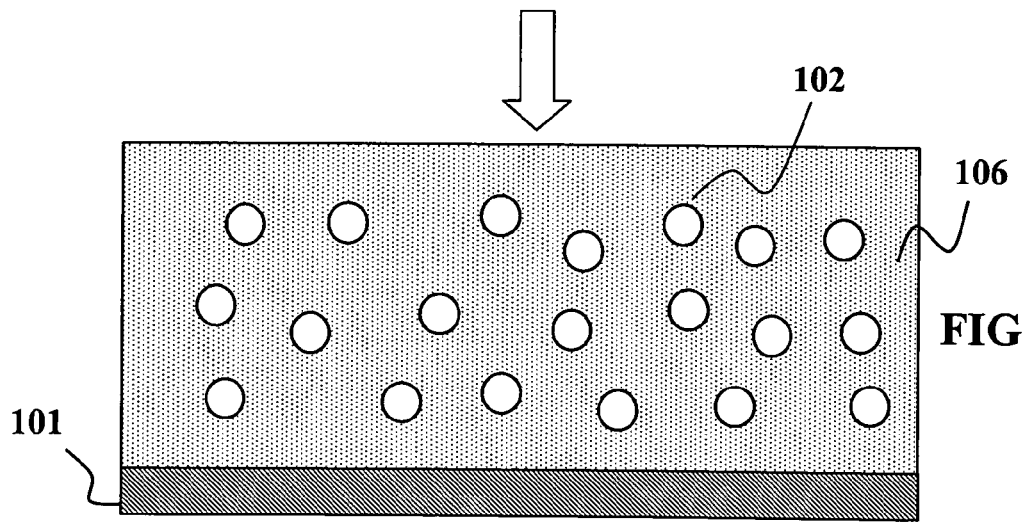
Figure 1C:
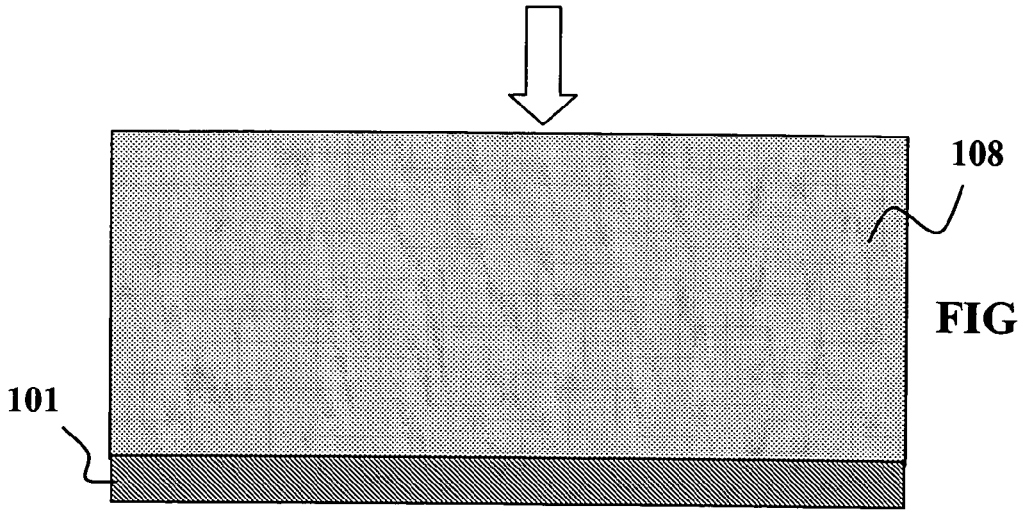

The mixture of binary alloy chalcogenide nanoparticles 102 and chalcogen particles 104 is placed on the substrate 101 and heated to a temperature sufficient to melt the extra chalcogen particles 104 to form a liquid chalcogen 106 as shown in FIG. 1B. The liquid chalcogen 106 and binary nanoparticles 102 are heated to a temperature sufficient to react the liquid chalcogen 106 with the binary chalcogenide nanoparticles 102 to form a dense film of a group IB-IIIA-chalcogenide compound 108 as shown in FIG. 1C. The dense film of group IB-IIIA-chalcogenide compound is then cooled down.

The binary chalcogenide particles 102 may be obtained starting from a binary chalcogenide feedstock material, e.g., micron size particles or larger. Examples of chalcogenide materials available commercially are listed in Table I below.

TABLE I

| Chemical | Formula | Typical % Purity |
| --- | --- | --- |
| Aluminum selenide | Al2Se3 | 99.5 |
| Aluminum sulfide | Al2S3 | 98 |
| Aluminum sulfide | Al2S3 | 99.9 |
| Aluminum telluride | Al2Te3 | 99.5 |
| Copper selenide | Cu—Se | 99.5 |
| Copper selenide | Cu2Se | 99.5 |
| Gallium selenide | Ga2Se3 | 99.999 |
| Copper sulfide | Cu2S(may be Cu1.8-2S) | 99.5 |
| Copper sulfide | CuS | 99.5 |
| Copper sulfide | CuS | 99.99 |
| Copper telluride | CuTe(generally Cu1.4Te) | 99.5 |
| Copper telluride | Cu2Te | 99.5 |
| Gallium sulfide | Ga2S3 | 99.95 |
| Gallium sulfide | GaS | 99.95 |
| Gallium telluride | GaTe | 99.999 |
| Gallium telluride | Ga2Te3 | 99.999 |
| Indium selenide | In2Se3 | 99.999 |
| Indium selenide | In2Se3 | 99.99% |
| Indium selenide | In2Se3 | 99.9 |
| Indium selenide | In2Se3 | 99.9 |
| Indium sulfide | InS | 99.999 |
| Indium sulfide | In2S3 | 99.99 |
| Indium telluride | In2Te3 | 99.999 |
| Indium telluride | In2Te3 | 99.999 |

The binary chalcogenide feedstock may be ball milled to produce particles of the desired size. Binary alloy chalcogenide particles such as GaSe may alternatively be formed by pyrometallurgy. In addition InSe nanoparticles may be formed by melting In and Se together (or InSe feedstock) and spraying the melt to form droplets that solidify into nanoparticles.

The chalcogen particles 104 may be larger than the binary chalcogenide nanoparticles 102 since chalcogen particles 104 melt before the binary nanoparticles 102 and provide good contact with the material of the binary nanoparticles 102. Preferably the chalcogen particles 104 are smaller than the thickness of the IB-IIIA-chalcogenide film 108 that is to be formed.

The chalcogen particles 104 (e.g., Se or S) may be formed in several different ways. For example, Se or S particles may be formed starting with a commercially available fine mesh powder (e.g., 200 mesh/75 micron) and ball milling the powder to a desirable size. Examples of chalcogen powders and other feedstocks commercially available are listed in Table II below.

TABLE II

| Chemical | Formula | Typical % Purity |
| --- | --- | --- |
| Selenium metal | Se | 99.99 |
| Selenium metal | Se | 99.6 |
| Selenium metal | Se | 99.6 |
| Selenium metal | Se | 99.999 |
| Selenium metal | Se | 99.999 |
| Sulfur | S | 99.999 |
| Tellurium metal | Te | 99.95 |
| Tellurium metal | Te | 99.5 |
| Tellurium metal | Te | 99.5 |
| Tellurium metal | Te | 99.9999 |
| Tellurium metal | Te | 99.99 |
| Tellurium metal | Te | 99.999 |
| Tellurium metal | Te | 99.999 |
| Tellurium metal | Te | 99.95 |
| Tellurium metal | Te | 99.5 |

Se or S particles may alternatively be formed using an evaporation-condensation method. Alternatively, Se or S feedstock may be melted and sprayed ("atomization") to form droplets that solidify into nanoparticles.

The chalcogen particles 104 may also be formed using a solution-based technique, which also is called a "Top-Down" method (Nano Letters, 2004 Vol. 4, No. 10 2047-2050 "Bottom-Up and Top-Down Approaches to Synthesis of Monodispersed Spherical Colloids of low Melting-Point Metals"—Yuliang Wang and Younan Xia). This technique allows processing of elements with melting points below 400° C. as monodispersed spherical colloids, with a diameter controllable from 100 nm to 600 nm, and in copious quantities. For this technique, chalcogen (Se or S) powder is directly added to boiling organic solvent, such as di(ethylene glycol,) and melted to produce big droplets. After the reaction mixture had been vigorously stirred and thus emulsified for 20 min, uniform spherical colloids of metal obtained as the hot mixture is poured into a cold organic solvent bath (e.g. ethanol) to solidify the chalcogen (Se or Se) droplets.

Figure 2A:
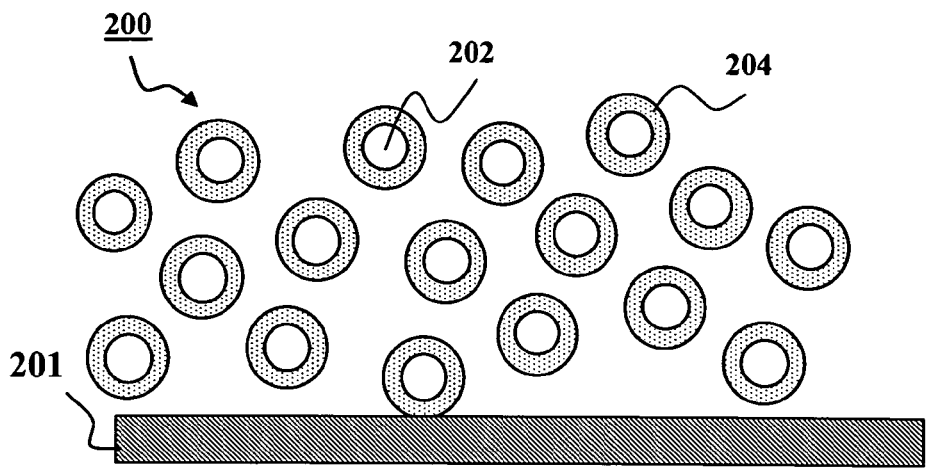
FIGS. 2A-2C are a sequence of schematic diagrams illustrating the formation of chalcogenide film from coated nanoparticles according to an alternative embodiment of the present invention.
Figure 2B:
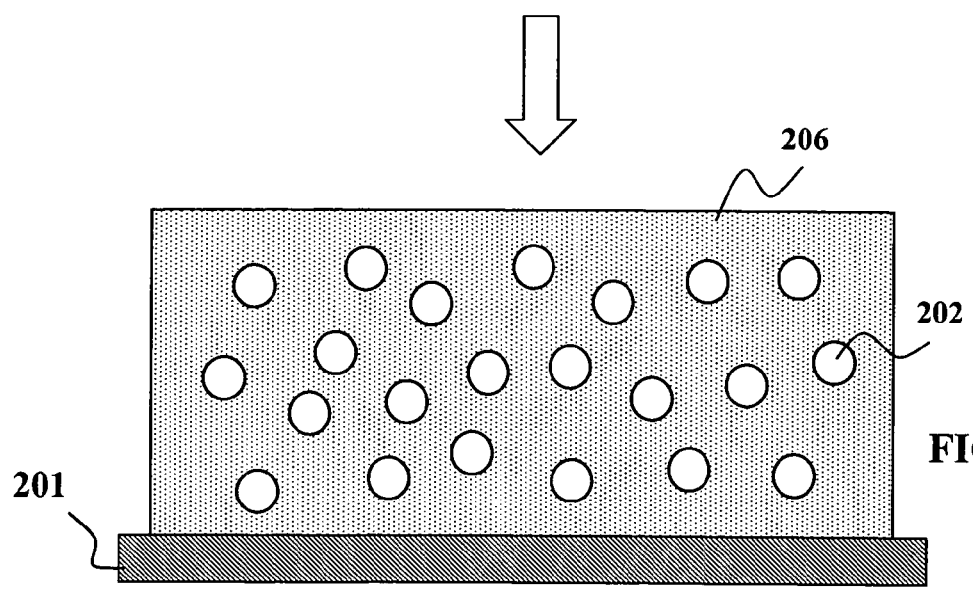
Figure 2C:
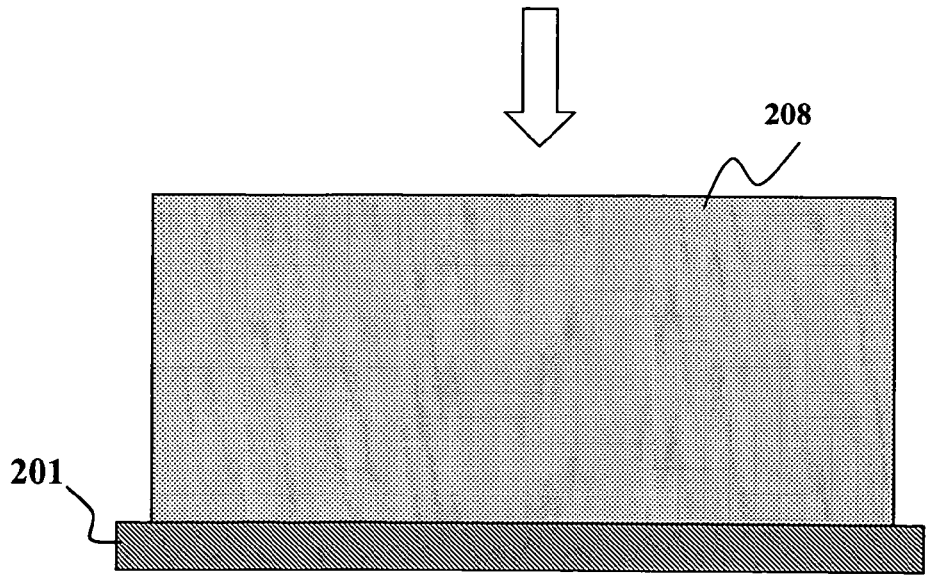

According to another embodiment of the present invention, a film of a group IB-IIIA-chalcogenide compound may be formed on a substrate 201 using core-shell nanoparticles 200 as shown in FIGS. 2A-2C. Each core-shell nanoparticle 200 has a core nanoparticle covered by a coating 204. The core nanoparticles 202 may be a mix of elemental particles of groups IB (e.g., Cu) and IIIA (e.g., Ga and In), which may be obtained by ball milling of elemental feedstock to a desired size. Examples of elemental feedstock materials available are listed in Table III below.

TABLE III

| Chemical | Formula | Typical % Purity |
| --- | --- | --- |
| Copper metal | Cu | 99.99 |
| Copper metal | Cu | 99 |
| Copper metal | Cu | 99.5 |
| Copper metal | Cu | 99.5 |
| Copper metal | Cu | 99 |
| Copper metal | Cu | 99.999 |
| Copper metal | Cu | 99.999 |
| Copper metal | Cu | 99.9 |
| Copper metal | Cu | 99.5 |
| Copper metal | Cu | 99.9 |
| | | ($O_2$ typ. 2-10%) |
| Copper metal | Cu | 99.99 |
| Copper metal | Cu | 99.997 |
| Copper metal | Cu | 99.99 |
| Gallium metal | Ga | 99.999999 |
| Gallium metal | Ga | 99.99999 |
| Gallium metal | Ga | 99.99 |
| Gallium metal | Ga | 99.9999 |
| Gallium metal | Ga | 99.999 |
| Indium metal | In | 99.9999 |
| Indium metal | In | 99.999 |
| Indium metal | In | 99.999 |
| Indium metal | In | 99.99 |
| Indium metal | In | 99.999 |
| Indium metal | In | 99.99 |
| Indium metal | In | 99.99 |

The core elemental nanoparticles 202 also may be obtained by evaporation-condensation, electro-explosion of wires and other techniques. Alternatively, the core nanoparticles 202 may be binary nanoparticles containing group IB and/or IIIA (e.g. CuSe, GaSe and InSe) as described above with respect to FIGS. 1A-1C. Furthermore, the core nanoparticles 202 may be ternary nanoparticles containing two different group IIIA elements (e.g. In and Ga) and a chalcogen (Se or S) or a group IB element.

Combinations of binary, ternary and elemental nanoparticles may also be used as the core nanoparticles 202. The coating 204 on the core nanoparticle 202 contains elemental non-oxygen chalcogen material (e.g. Se or S) as a source of extra chalcogen. The size of the core nanoparticles 202 is generally less than about 500 nm, preferably less than about 200 mm The core-shell nanoparticles 200 are heated to a temperature sufficient to melt the extra chalcogen coating 204 to form a liquid chalcogen 206 as shown in FIG. 2B. The liquid chalcogen 206 and core nanoparticles 202 are heated to a temperature sufficient to react the liquid chalcogen 206 with the core nanoparticles 202 to form a dense film of group IB-IIIA-chalcogenide compound 208 as shown in FIG. 2C. The dense film of group IB-IIIA-chalcogenide is cooled down.

There are a number of different ways of forming the chalcogen coating 204 of the core-shell nanoparticles 200. Chalcogen shell 204 may be formed by agitating the core nanoparticles 202 into an airborne form, e.g. in an inert atmosphere of nitrogen or argon, and coating the core nanoparticles 202 by atomic layer deposition (ALD). The core nanoparticles 202 may be agitated into an airborne form, e.g., by placing them on a support and ultrasonically vibrating the support. ALD-based synthesis of coated nanoparticles may (optionally) use a metal organic precursor containing selenium such as dimethyl selenide, dimethyl diselenide, or diethyl diselenide or a sulfur-containing metal organic precursor, or $H_2Se$ or $H_2S$, or other selenium- or sulfur-containing compounds, and combinations or mixtures of the above. Both of these techniques are described in commonly-assigned U.S. patent application Ser. No. 10/943,657, which has been incorporated herein by reference. Other examples of coating nanoparticles are described in detail in commonly-assigned U.S. patent application Ser. No. 10/943,657, which has been incorporated herein by reference. Note that during or after deposition of the shell on the core, the shell might partially react with the core, effectively resulting in a thinner chalcogen shell on a partially reacted core.

Alternatively, the coating 204 may be formed by agitating the core nanoparticles 202 into an airborne form, e.g. in an inert atmosphere of nitrogen or argon, and exposing the airborne core nanoparticles to a vaporized chalcogen Se or S.

Figure 3:
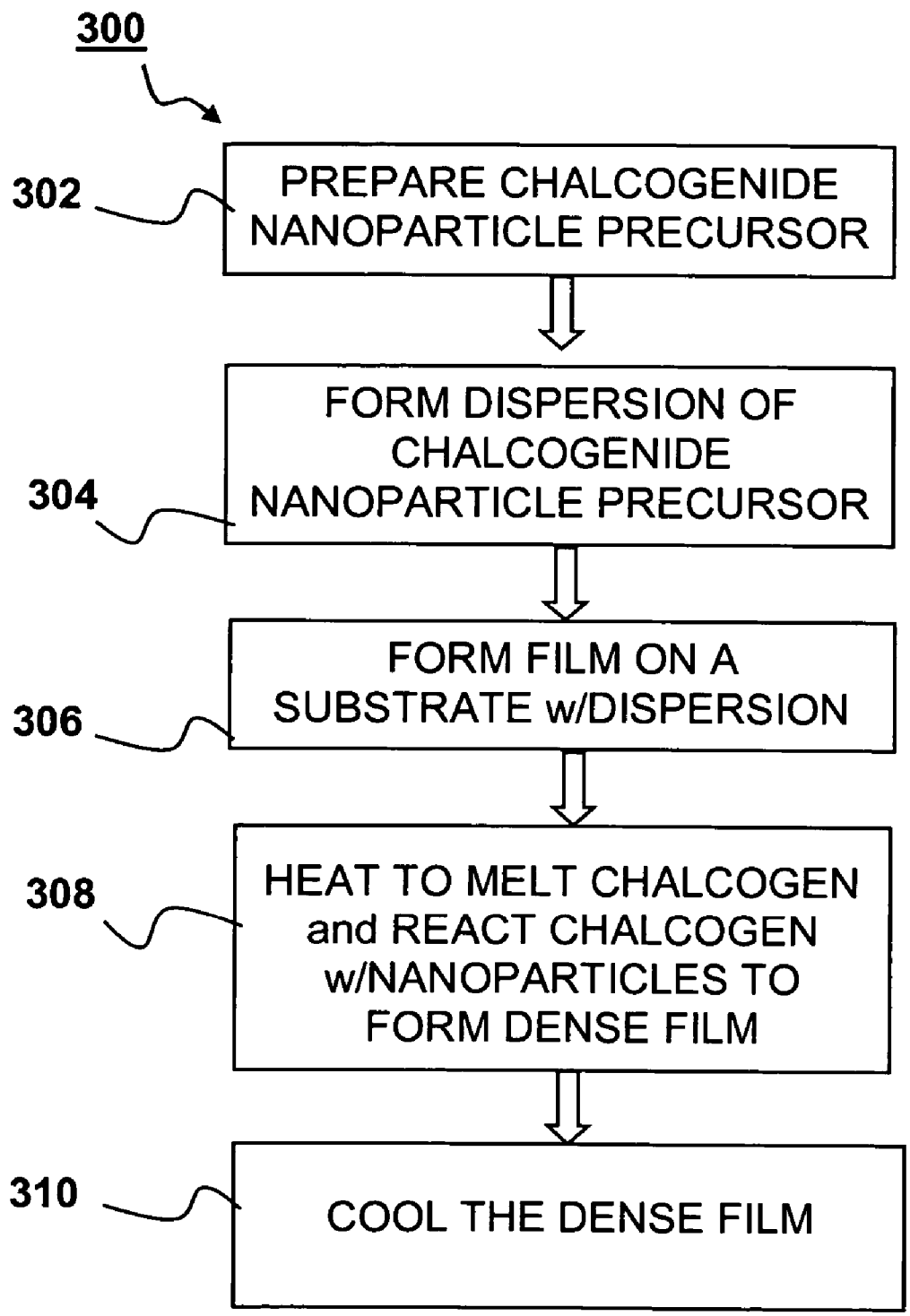
FIG. 3 is a flow diagram illustrating the fabrication of a chalcogenide layer using inks formed from nanoparticles according to an embodiment of the present invention.

Binary chalcogenide particles and extra chalcogen as described above with respect to FIG. 1A or core-shell nanoparticles as described above with respect to FIG. 2A may be mixed with solvents and other components to form an ink for solution deposition onto a substrate. The flow diagram of FIG. 3 illustrates a method 300 for forming a IB-IIIA-chalcogenide layer using inks formed from nanoparticle-based precursors. The method begins at step 302 by mixing the nanoparticles, e.g., binary chalcogenide particles and source of extra chalcogen, core-shell nanoparticles or some combination of both.

At step 304 a dispersion, e.g., an ink, paint or paste, is formed with the nanoparticles. Generally, an ink may be formed by dispersing the nanoparticles in a dispersant (e.g., a surfactant or polymer) along with (optionally) some combination of other components commonly used in making inks. Solvents can be aqueous (water-based) or non-aqueous (organic). Other components include, without limitation, binders, emulsifiers, anti-foaming agents, dryers, solvents, fillers, extenders, thickening agents, film conditioners, anti-oxidants, flow and leveling agents, plasticizers and preservatives. These components can be added in various combinations to improve the film quality and optimize the coating properties of the nanoparticulate dispersion. An alternative method to mixing nanoparticles and subsequently preparing a dispersion from these mixed nanoparticles (steps 302 and 304) would be to prepare separate dispersions for each individual type of nanoparticle and subsequently mixing these dispersions.

At step 306 a thin precursor film of the dispersion is then formed on a substrate by any of a variety of solution-based coating techniques including but not limited to wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, inkjet printing, jet deposition, spray deposition, and the like. The use of these and related coating and/or printing techniques in the non-vacuum based deposition of an ink, paste, or paint is not limited to ink, paste, and/or paints formed from nanoparticulates derived by the methods described above, but also using nanoparticles formed through a wide variety of other nanoparticles synthesis techniques, including but not limited to those described, e.g., in Published PCT Application WO 2002/084708 or commonly assigned U.S. patent application Ser. No. 10/782,017. The substrate may be an aluminum foil substrate or a polymer substrate, which is a flexible substrate in a roll-to-roll manner (either continuous or segmented or batch) using a commercially available web coating system. Aluminum foil is preferred since it is readily available and inexpensive.

In some embodiments, the extra chalcogen, e.g., micron- or sub-micron-sized chalcogen powder is mixed into the dispersion containing the metal chalcogenides (in binary selenide or core-shell form) so that the nanoparticles and extra chalcogen are deposited at the same time. Alternatively the chalcogen powder may be deposited on the substrate in a separate solution-based coating step before or after depositing the dispersion containing the metal chalcogenides. Furthermore, the dispersion may include additional group IIIA elements, e.g., gallium in metallic form, e.g., as nanoparticles and/or nanoglobules and/or nanodroplets.

At step 308, the thin precursor film is heated to a temperature sufficient to melt the chalcogen source. The dispersion is further heated to react the chalcogen with other components. The temperature is preferably between 375° C. (temperature for reaction) and 500° C. (a safe temperature range for processing on aluminum foil or high-melting-temperature polymer substrates). At step 310, the at least partially molten thin film and substrate are cooled down.

Note that the solution-based deposition of the proposed mixtures of nanopowders does not necessarily have to be performed by depositing these mixtures in a single step. Alternatively, step 306 may be performed by sequentially depositing nanoparticulate dispersions having different compositions of IB-, IIIA- and chalcogen-based particulates in two or more steps. For example would be to first deposit a dispersion containing an indium selenide nanopowder (e.g. with an In-to-Se ratio of ~1), and subsequently deposit a dispersion of a copper selenide nanopowder (e.g. with a Cu-to-Se ratio of ~1) and a gallium selenide nanopowder (e.g. with a Ga-to-Se ratio of ~1) followed by depositing a dispersion of Se. This would result in a stack of three solution-based deposited layers, which may be sintered together. Alternatively, each layer may be heated or sintered before depositing the next layer. A number of different sequences are possible. For example, a layer of $In_xGa_ySe_z$ with $x \geq 0$ (larger than or equal to zero), $y \geq 0$ (larger than or equal to zero), and $z \geq 0$ (larger than or equal to zero), may be formed as described above on top of a uniform, dense layer of $Cu_wIn_xGa_y$ with $w \geq 0$ (larger than or equal to zero), $x \geq 0$ (larger than or equal to zero), and $y \geq 0$ (larger than or equal to zero), and subsequently converting (sintering) the two layers into CIGS. Alternatively a layer of $Cu_wIn_xGa_y$ may be formed on top of a uniform, dense layer of $In_xGa_ySe_z$ and subsequently converting (sintering) the two layers into CIGS.

In alternative embodiments, nanoparticulate-based dispersions as described above may further include elemental IB, and/or IIIA nanoparticles (e.g., in metallic form). For example $Cu_xIn_yGa_zSe_u$ nanopowders, with $u > 0$ (larger than zero), with $x \geq 0$ (larger than or equal to zero), $y \geq 0$ (larger than or equal to zero), and $z \geq 0$ (larger than or equal to zero), may be combined with an additional source of selenium (or other chalcogen) and metallic gallium into a dispersion that is formed into a film on the substrate and sintered. Metallic gallium nanoparticles and/or nanoglobules and/or nanodroplets may be formed, e.g., by initially creating an emulsion of liquid gallium in a solution. Gallium metal or gallium metal in a solvent with or without emulsifier may be heated to liquefy the metal, which is then sonicated and/or otherwise mechanically agitated in the presence of a solvent. Agitation may be carried out either mechanically, electromagnetically, or acoustically in the presence of a solvent with or without a surfactant, dispersant, and/or emulsifier. The gallium nanoglobules and/or nanodroplets can then be manipulated in the form of a solid-particulate, by quenching in an environment either at or below room temperature to convert the liquid gallium nanoglobules into solid gallium nanoparticles. This technique is described in detail in commonly-assigned U.S. patent application Ser. No. 11/081,163 to Matthew R. Robinson and Martin R. Roscheisen entitled "Metallic Dispersion", the entire disclosures of which are incorporated herein by reference.

Note that the method 300 may be optimized by using, prior to, during, or after the solution deposition and/or sintering of one or more of the precursor layers, any combination of (1) any chalcogen source that can be solution-deposited, e.g. a Se or S nanopowder mixed into the precursor layers or deposited as a separate layer, (2) chalcogen (e.g., Se or S) evaporation, (3) an $H_2Se$ ($H_2S$) atmosphere, (4) a chalcogen (e.g., Se or S) atmosphere, (5), an organo-selenium containing atmosphere, e.g. diethylselenide (6) an $H_2$ atmosphere, (7) another reducing atmosphere, e.g. CO, (8) a wet chemical reduction step, and a (9) heat treatment.

Figure 4:
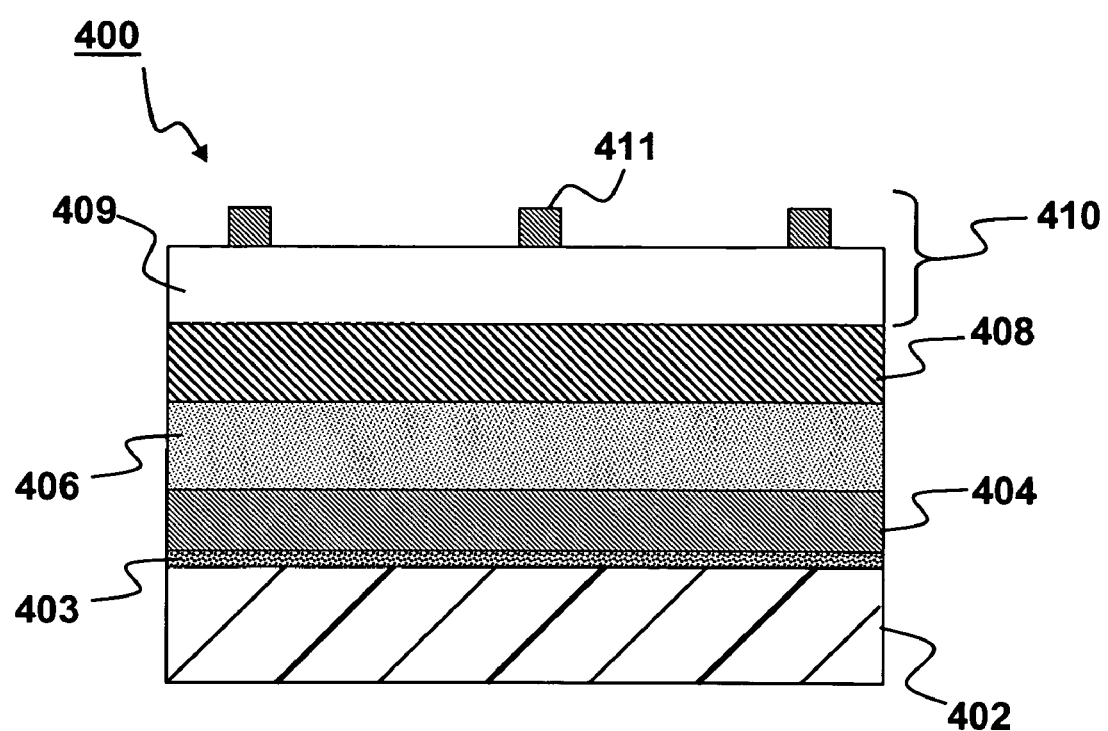
FIG. 4 is a schematic diagram of a photovoltaic cell according to an embodiment of the present invention.

Dense IB-IIIA-chalcogenide films fabricated as described above with respect to FIG. 3 may be used as absorber layers in photovoltaic cells. FIG. 4 depicts an example of a photovoltaic cell 400 that uses a combination of a IB-IIIA-chalcogenide film as components of an absorber layer. The cell 400 generally includes a substrate or base layer 402, a base electrode 404, a IB-IIIA-chalcogenide absorber layer 406, a window layer 408, and a transparent electrode 410. The base layer 402 may be made from a thin flexible material suitable for roll-to-roll processing. By way of example, the base layer may be made of a metal foil, such as titanium, aluminum, stainless steel, molybdenum, or a plastic or polymer, such as polyimides (PI), polyamides, polyetheretherketone (PEEK), Polyethersulfone (PES), polyetherimide (PEI), polyethylene naphtalate (PEN), Polyester (e.g. PET), or a metallized plastic. The base electrode 404 is made of an electrically conductive material. By way of example, the base electrode 404 may be a layer of Al foil, e.g., about 10 microns to about 100 microns thick. An optional interfacial layer 403 may facilitate bonding of the electrode 404 to the substrate 402. The adhesion can be comprised of a variety of materials, including but not limited to chromium, vanadium, tungsten, and glass, or compounds such as nitrides, oxides, and/or carbides.

The IB-IIIA-chalcogenide absorber layer 406 may be about 0.5 micron to about 5 microns thick after annealing, more preferably from about 0.5 microns to about 2 microns thick after annealing.

The window layer 408 is typically used as a junction partner for the IB-IIIA-chalcogenide absorber layer 406. By way of example, the window layer may include cadmium sulfide (CdS), zinc sulfide (ZnS), or zinc selenide (ZnSe), or n-type organic materials (e.g. polymers or small molecules), or some combination of two or more of these or similar materials. Layers of these materials may be deposited, e.g., by chemical bath deposition, to a thickness of about 1 nm to about 500 nm.

The transparent electrode 410 may include a transparent conductive oxide layer 409, e.g., zinc oxide (ZnO) or aluminum doped zinc oxide (ZnO:Al), or Indium Tin Oxide (ITO), or cadmium stannate, any of which can be deposited using any of a variety of means including but not limited to sputtering, evaporation, CBD, electroplating, CVD, PVD, ALD, and the like.

Alternatively, the transparent electrode 410 may include a transparent conductive organic (polymeric or a mixed polymeric-molecular), or a hybrid (organic-inorganic) layer 409, e.g. a transparent layer of doped PEDOT (Poly-3,4-Ethylenedioxythiophene), which can be deposited using spin, dip, or spray coating, and the like. PSS:PEDOT is a doped conducting polymer based on a heterocyclic thiophene ring bridged by a diether. A water dispersion of PEDOT doped with poly (styrenesulfonate) (PSS) is available from H.C. Starck of Newton, Mass. under the trade name of Baytron® P. Baytron® is a registered trademark of Bayer Aktiengesellschaft (hereinafter Bayer) of Leverkusen, Germany. In addition to its conductive properties, PSS:PEDOT can be used as a planarizing layer, which can improve device performance. A potential disadvantage in the use of PEDOT is the acidic character of typical coatings, which may serve as a source through which the PEDOT chemically may attack, react with, or otherwise degrade the other materials in the solar cell. Removal of acidic components in PEDOT can be carried out by anion exchange procedures. Non-acidic PEDOT can be purchased commercially. Alternatively, similar materials can be purchased from TDA materials of Wheat Ridge, Colo., e.g. Oligotron™ and Aedotron™. The transparent electrode 410 may further include a layer of metal (e.g., Ni, Al or Ag) fingers 411 to reduce the overall sheet resistance.

An optional encapsulant layer (not shown) provides environmental resistance, e.g., protection against exposure to water or air. The encapsulant may also absorb UV-light to protect the underlying layers. Examples of suitable encapsulant materials include one or more layers of polymers such as THZ, Tefzel® (DuPont), tefdel, thermoplastics, polyimides (PI), polyamides, polyetheretherketone (PEEK), Polyethersulfone (PES), polyetherimide (PEI), polyethylene naphtalate (PEN), Polyester (PET), nanolaminate composites of plastics and glasses (e.g. barrier films such as those described in commonly-assigned, co-pending U.S. Patent Application Publication 2005/0095422, to Brian Sager and Martin Roscheisen, filed Oct. 31, 2003, and entitled "INORGANIC/ORGANIC HYBRID NANOLAMINATE BARRIER FILM", which is incorporated herein by reference), and combinations of the above.

Embodiments of the present invention provide low-cost, highly tunable, reproducible, and rapid synthesis of a nanoparticulate chalcogenide and chalcogen material for use as an ink, paste, or paint in solution-deposited absorber layers for solar cells. Coating the nanoparticles allows for precisely tuned stoichiometry, and/or phase, and/or size, and/or orientation, and/or shape of the chalcogenide crystals in the chalcogenide film e.g., for a CIGS polycrystalline film. Embodiments of the present invention provide an absorber layer with several desirable properties, including but not limited to relatively high density, high uniformity, low porosity, and minimal phase segregation.

Chalcogen-rich Chalcogenide Particles

Figure 5A:
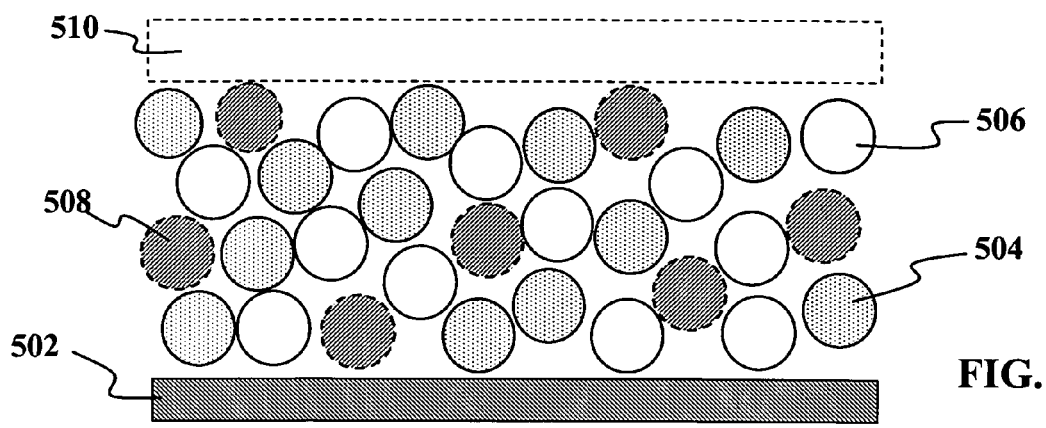
FIGS. 5A-5C shows the use of chalcogenide planar particles according to one embodiment of the present invention.
Figure 5B:
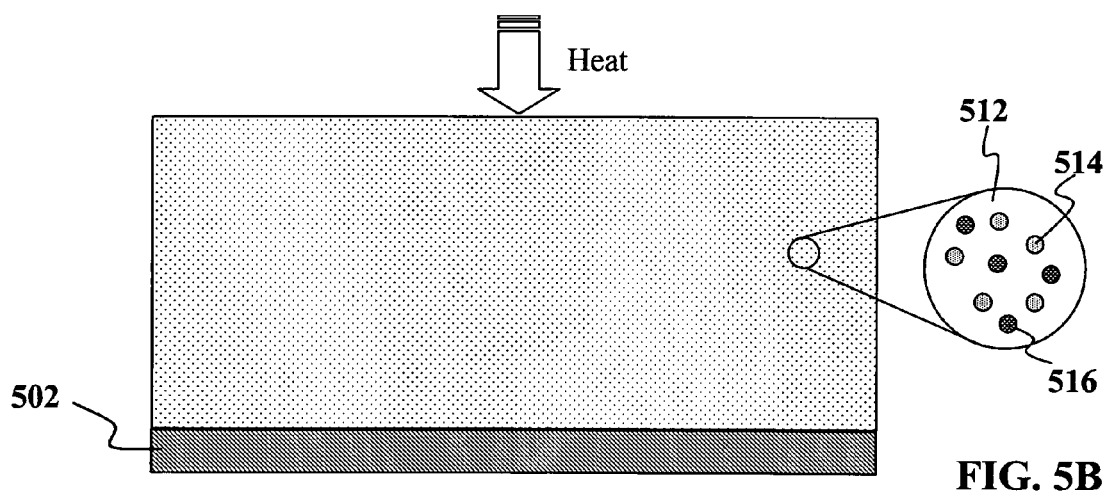
Figure 5C:
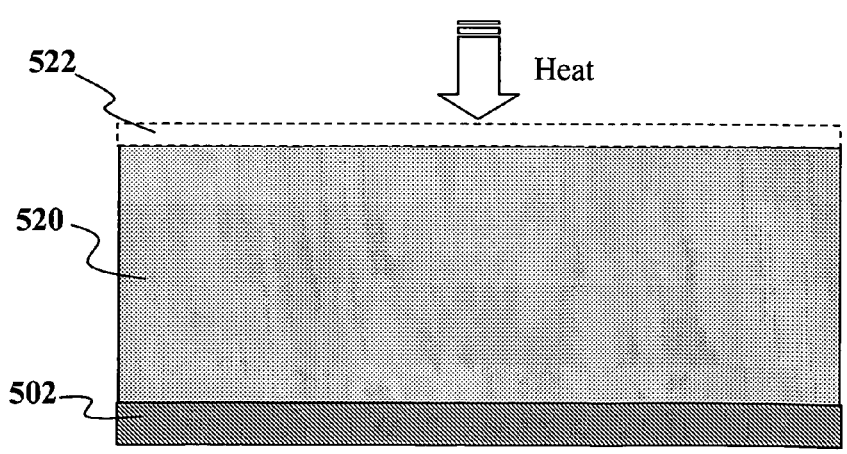

Referring now to FIGS. 5A-5C, it should be understood that yet another embodiment of the present invention includes embodiments where the nanoparticles may be chalcogenide particles that are chalcogen-rich (whether they be group IB-chalcogenides, group IIIA chalcogenides, or other chalcogenides). In these embodiments, the use of a separate source of chalcogen may not be needed since the excess chalcogen is contained within the chalcogenide particles themselves. In one nonlimiting example of a group IB-chalcogenide, the chalcogenide may be copper selenide, wherein the material comprises $Cu_xSe_y$, wherein x<y. Thus, this is a chalcogen-rich chalcogenide that will provide excess amounts of selenium when the particles of the precursor material are processed.

The purpose of providing an extra source of chalcogen is to first create liquid to enlarge the contact area between the initial solid particles and the liquid. Secondly, when working with chalcogen-poor films, the extra source adds chalcogen to get to the stoichiometric desired chalcogen amount. Third, chalcogens such as Se are volatile and inevitably some of the chalcogen is lost during processing. So, the main purpose is to create liquid. There are also a variety of other routes to increase the amount of liquid when the precursor layer is processed. These routes include but are not limited to: 1)

Cu—Se more Se-rich than Cu2-xSe (>377C, even more liquid above >523C); 2) Cu—Se equal to or more Se-rich than Cu2Se when adding additional Se (>220C); 3) In—Se of composition In4Se3, or in between In4Se3 and In1Se1 (>550C); 4) In—Se equal to or more Se-rich than In4Se3 when adding additional Se (>220C); 5) In—Se in between In and In4Se3 (>156C, preferably in an oxygen-free environment since In is created 6) Ga-emulsion (>29C, preferably oxygen-free); and hardly (but possible) for Ga—Se. Even when working with Se vapor, it would still be advantageous to create additional liquid in the precursor layer itself using one of the above methods or by a comparable method. It should also be understood that in some embodiments, the extra source of chalcogen is not limited to only elemental chalcogen, but in some embodiments, may be an alloy and/or solution of one or more chalcogens.

Optionally, it should be understood that the extra source of chalcogen may be mixed with and/or deposited within the precursor layer, instead of as a discrete layer. In one embodiment, oxygen-free particles or substantially oxygen free particles of chalcogen could be used. If the chalcogen is used with flakes and/or plate shaped precursor materials, densification might not end up an issue due to the higher density achieved by using planar particles, so there is no reason to exclude printing Se and/or other source of chalcogen within the precursor layer as opposed to a discrete layer. Flakes may include both microflakes and/or nanoflakes.

In still other embodiments of the present invention, multiple layers of material may be printed and reacted with chalcogen before deposition of the next layer. One nonlimiting example would be to deposit a Cu—In—Ga layer, anneal it, then deposit an Se layer then treat that with RTA, follow that up by depositing another precursor layer rich in Ga, followed by another deposition of Se, and finished by a second RTA treatment. More generically, this may include forming a precursor layer (either heat or not) then coating a layer of the extra source of chalcogen (then heat or not) then form another layer of more precursor (heat or not) and then for another layer of the extra source of chalcogen (then heat or not) and repeat as many times as desired to grade the composition or nucleating desired crystal sizes. In one nonlimiting example, this may be used to grade the gallium concentration. In another embodiment, this may be used to grade the copper concentration. In yet another embodiment, this may be used to grade the indium concentration. In a still further embodiment, this may be used to grade the selenium concentration. In yet another embodiment this may be used to grade the selenium concentration. Another reason would be to first grow copper rich films to get big crystals and then to start adding copper-poor layers to get the stoichiometry back. Of course this embodiment can combined to allow the chalcogen to be deposited in the precursor layer for any of the steps involved.

Referring now to FIG. 5A, it should be understood that the ink may contain multiple types of particles. In FIG. 5A, the particles 504 are a first type of particle and the particles 506 are a second type of particle. In one nonlimiting example, the ink may have multiple types of particles wherein only one type of particle is a chalcogenide and is also chalcogen-rich. In other embodiments, the ink may have particles wherein at least two types of chalcogenides in the ink are chalcogen-rich. As a nonlimiting example, the ink may have $Cu_xSe_y$ (wherein x<y) and $In_aSe_b$ (wherein a<b). In still further embodiments, the ink may have particles 504, 506, and 508 (shown in phantom) wherein at least three types of chalcogenide particles are in the ink. By way of nonlimiting example, the chalcogen-rich chalcogenide particles may be Cu—Se, In—Se, and/or Ga—Se. All three may be chalcogen-rich. A variety of combinations are possible to obtain the desired excess amount of chalcogen. If the ink has three types of particles, it should be understood that not all of the particles need to be chalcogenides or chalcogen rich. Even within an ink with only one type of particle, e.g. Cu—Se, there may be a mixture of chalcogen-rich particles, e.g. $Cu_xSe_y$ with x<y, and non-chalcogen-rich particles, e.g. $Cu_xSe_y$ with x>y. As a nonlimiting example, a mixture may contain particles of copper selenide that may have the following compositions: $Cu_1Se_1$ and $Cu_1Se_2$.

Referring still to FIG. 5A, it should also be understood that even with the chalcogen-rich particles, an additional layer 510 (shown in phantom) may be also printed or coated on to the ink to provide an excess source of chalcogen as described previously. The material in this layer may be a pure chalcogen, a chalcogenide, or a compound that contains chalcogen. As seen in FIG. 5C, the additional layer 510 (shown in phantom) may also be printed onto the resulting film if further processing with chalcogen is desired.

Referring now to FIG. 5B, heat may be applied to the particles 504 and 506 to begin converting them. Due to the various melting temperatures of the materials in the particles, some may start to assume a liquid form sooner than others. In the present invention, this is particularly advantageous if the materials assuming liquid form also release the excess chalcogen as a liquid 512 which may surround the other materials and/or elements such as 514 and 516 in the layer. FIG. 10B includes a view with an enlarged view of the liquid 512 and materials and/or elements 514 and 516.

The amount of extra chalcogen provided by all of the particles overall is at a level that is equal to or above the stoichiometric level found in the compound after processing. In one embodiment of the present invention, the excess amount of chalcogen comprises an amount greater than the sum of 1) a stoichiometric amount found in the final IB-IIIA-chalcogenide film and 2) a minimum amount of chalcogen necessary to account for losses during processing to form the final IB-IIIA-chalcogenide having the desired stoichiometric ratio. Although not limited to the following, the excess chalcogen may act as a flux that will liquefy at the processing temperature and promote greater atomic intermixing of particles provided by the liquefied excess chalcogen. The liquefied excess chalcogen may also ensure that sufficient chalcogen is present to react with the group IB and IIIA elements. The excess chalcogen helps to "digest" or "solubilize" the particles and/or flakes. The excess chalcogen will escape from the layer before the desired film is fully formed.

Referring now to FIG. 5C, heat may continue to be applied until the group IB-IIIA chalcogenide film 520 is formed. Another layer 522 (shown in phantom) may be applied for further processing of the film 520 if particular features are desired. As a nonlimiting example, an extra source of gallium may be added to the top layer and further reacted with the film 520. Others sources may provide additional selenium to improve selenization at the top surface of the film 520.

It should be understood that a variety of chalcogenide particles may also be combined with non-chalcogenide particles to arrive at the desired excess supply of chalcogen in the precursor layer. The following table (Table IV) provides a non-limiting matrix of some of the possible combinations between chalcogenide particles listed in the rows and the non-chalcogenide particles listed in the columns.

TABLE IV

| | Cu | In | Ga | Cu—In |
|---|---|---|---|---|
| Se | Se + Cu | Se + In | Se + Ga | Se + Cu—In |
| Cu—Se | Cu—Se + Cu | Cu—Se + In | Cu—Se + Ga | Cu—Se + Cu—In |
| In—Se | In—Se + Cu | In—Se + In | In—Se + Ga | In—Se + Cu—In |
| Ga—Se | Ga—Se + Cu | Ga—Se + In | Ga—Se + Ga | Ga—Se + Cu—In |
| Cu—In—Se | Cu—In—Se + Cu | Cu—In—Se + In | Cu—In—Se + Ga | Cu—In—Se + Cu—In |
| Cu—Ga—Se | Cu—Ga—Se + Cu | Cu—Ga—Se + In | Cu—Ga—Se + Ga | Cu—Ga—Se + Cu—In |
| In—Ga—Se | In—Ga—Se + Cu | In—Ga—Se + In | In—Ga—Se + Ga | In—Ga—Se + CuIn |
| Cu—In—Ga—Se | Cu—In—Ga—Se + Cu | Cu—In—Ga—Se + In | Cu—In—Ga—Se + Ga | Cu—In—Ga—Se + CuIn |

| | Cu—Ga | In—Ga | Cu—In—Ga |
|---|---|---|---|
| Se | Se + Cu—Ga | Se + In—Ga | Se + Cu—In—Ga |
| Cu—Se | Cu—Se + Cu—Ga | Cu—Se + In—Ga | Cu—Se + Cu—In—Ga |
| In—Se | In—Se + Cu—Ga | In—Se + In—Ga | In—Se + Cu—In—Ga |
| Ga—Se | Ga—Se + Cu—Ga | Ga—Se + In—Ga | Ga—Se + Cu—In—Ga |
| Cu—In—Se | Cu—In—Se + Cu—Ga | Cu—In—Se + In—Ga | Cu—In—Se + Cu—In—Ga |
| Cu—Ga—Se | Cu—Ga—Se + Cu—Ga | Cu—Ga—Se + In—Ga | Cu—Ga—Se + Cu—In—Ga |
| In—Ga—Se | In—Ga—Se + Cu—Ga | In—Ga—Se + In—Ga | In—Ga—Se + Cu—In—Ga |
| Cu—In—Ga—Se | Cu—In—Ga—Se + CuGa | Cu—In—Ga—Se + InGa | Cu—In—Ga—Se + Cu—In—Ga |

In yet another embodiment, the present invention may combine a variety of chalcogenide particles with other chalcogenide particles. The following table (Table V) provides a nonlimiting matrix of some of the possible combinations between chalcogenide particles listed for the rows and chalcogenide particles listed for the columns.

TABLE V

| | Cu—Se | In—Se | Ga—Se | Cu—In—Se |
|---|---|---|---|---|
| Se | Se + Cu—Se | Se + In—Se | Se + Ga—Se | Se + Cu—In—Se |
| Cu—Se | Cu—Se | Cu—Se + In—Se | Cu—Se + Ga—Se | Cu—Se + Cu—In—Se |
| In—Se | In—Se + Cu—Se | In—Se | In—Se + Ga—Se | In—Se + Cu—In—Se |
| Ga—Se | Ga—Se + Cu—Se | Ga—Se + In—Se | Ga—Se | Ga—Se + Cu—In—Se |
| Cu—In—Se | Cu—In—Se + Cu—Se | Cu—In—Se + In—Se | Cu—In—Se + Ga—Se | Cu—In—Se |
| Cu—Ga—Se | Cu—Ga—Se + Cu—Se | Cu—Ga—Se + In—Se | Cu—Ga—Se + Ga—Se | Cu—Ga—Se + Cu—In—Se |
| In—Ga—Se | In—Ga—Se + Cu—Se | In—Ga—Se + In—Se | In—Ga—Se + Ga—Se | In—Ga—Se + Cu—In—Se |
| Cu—In—Ga—Se | Cu—In—Ga—Se + Cu—Se | Cu—In—Ga—Se + In—Se | Cu—In—Ga—Se + Ga—Se | Cu—In—Ga—Se + Cu—In—Se |

| | Cu—Ga—Se | In—Ga—Se | Cu—In—Ga—Se |
|---|---|---|---|
| Se | Se + Cu—Ga—Se | Se + In—Ga—Se | Se + Cu—In—Ga—Se |
| Cu—Se | Cu—Se + Cu—Ga—Se | Cu—Se + In—Ga—Se | Cu—Se + Cu—In—Ga—Se |
| In—Se | In—Se + Cu—Ga—Se | In—Se + In—Ga—Se | In—Se + Cu—In—Ga—Se |
| Ga—Se | Ga—Se + Cu—Ga—Se | Ga—Se + In—Ga—Se | Ga—Se + Cu—In—Ga—Se |
| Cu—In—Se | Cu—In—Se + Cu—Ga—Se | Cu—In—Se + In—Ga—Se | Cu—In—Se + Cu—In—Ga—Se |
| Cu—Ga—Se | Cu—Ga—Se | Cu—Ga—Se + In—Ga—Se | Cu—Ga—Se + Cu—In—Ga—Se |
| In—Ga—Se | In—Ga—Se + Cu—Ga—Se | In—Ga—Se | In—Ga—Se + Cu—In—Ga—Se |
| Cu—In—Ga—Se | Cu—In—Ga—Se + Cu—Ga—Se | Cu—In—Ga—Se + In—Ga—Se | Cu—In—Ga—Se |

Nucleation Layer

Figure 6A:
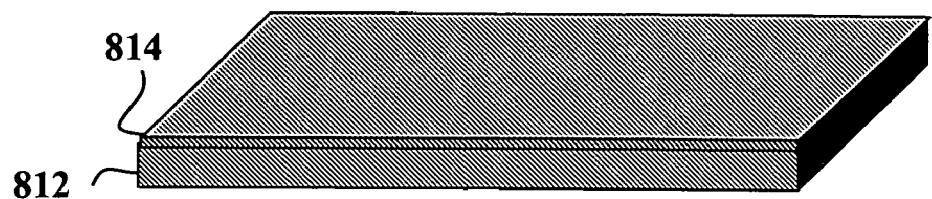
FIGS. 6A-6C show a nucleation layer according to one embodiment of the present invention.
Figure 6B:
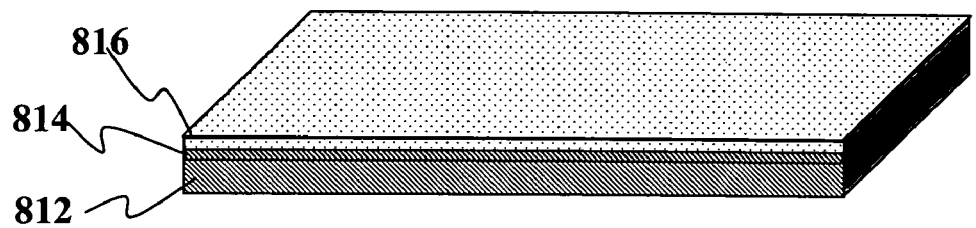
Figure 6C:
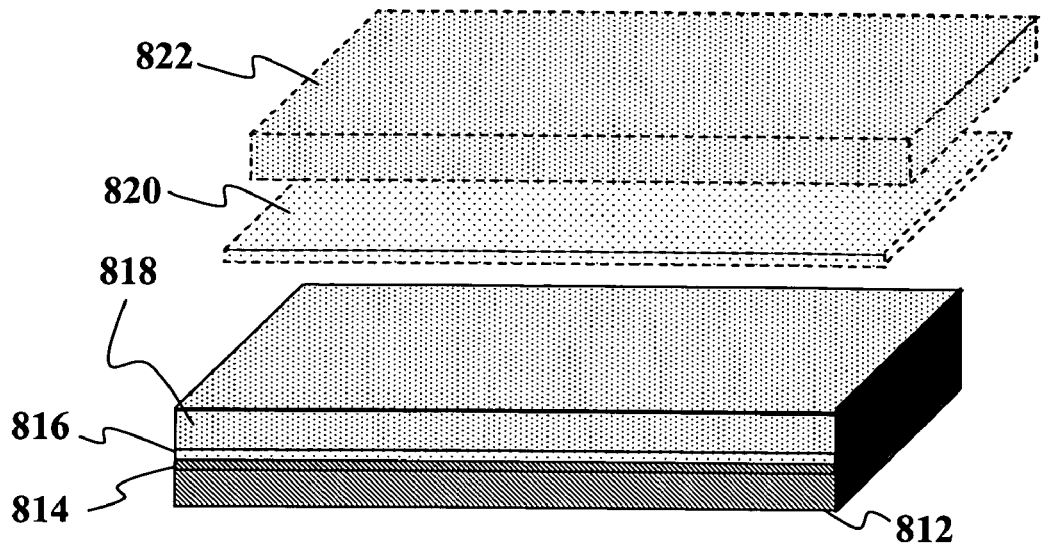

Referring now to FIGS. 6A-6C, yet another embodiment of the present invention using particles or flakes will now be described. This embodiment provides a method for improving crystal growth on the substrate by depositing a thin IB-IIIA chalcogenide layer on the substrate to serve as a nucleation plane for film growth for the precursor layer which is formed on top of the thin group IB-IIIA chalcogenide layer. This nucleation layer of a group IB-IIIA chalcogenide may be deposited, coated, or formed prior to forming the precursor layer. The nucleation layer may be formed using vacuum or non-vacuum techniques. The precursor layer formed on top of the nucleation layer may be formed by a variety of techniques including but not limited to using an ink containing a plurality of flakes or particles as described in this application. In one embodiment of the present invention, the nucleation layer may be viewed as being a layer where an initial IB-IIIA-VIA compound crystal growth is preferred over crystal growth in another location of the precursor layer and/or stacks of precursor layers.

FIG. 6A shows that the absorber layer may be formed on a substrate 812, as shown in FIG. 6A. A surface of the substrate 812, may be coated with a contact layer 814 to promote electrical contact between the substrate 812 and the absorber layer that is to be formed on it. By way of example, an aluminum substrate 812 may be coated with a contact layer 814 of molybdenum. As discussed herein, forming or disposing a material or layer of material on the substrate 812 includes disposing or forming such material or layer on the contact layer 814, if one is used.

As shown in FIG. 6B, a nucleation layer 816 is formed on the substrate 812. This nucleation layer may comprise of a group IB-IIIA chalcogenide and may be deposited, coated, or formed prior to forming the precursor layer. As a nonlimiting example, this may be a CIGS layer, a Ga—Se layer, any other high-melting IB-IIIA-chalcogenide layer, or even a thin layer of gallium.

Referring still to FIG. 6C, it should also be understood that the structure of the alternating nucleation layer and precursor layer may be repeated in the stack. FIG. 6C show that, optionally, another nucleation layer 820 (shown in phantom) may be formed over the precursor layer 818 to continue the structure of alternating nucleation layer and precursor layer. Another precursor layer 822 may then be formed over the nucleation layer 820 to continue the layering, which may be repeated as desired. Although not limited to the following, there may be 2, 3, 4, 5, 6, 7, 8, 9, 10, or more sets of alternating nucleation layers and precursor layers to build up the desired qualities. The each set may have different materials or amounts of materials as compared to other sets in the stack. The alternating layers may be solution deposited, vacuum deposited or the like. Different layers may be deposited by different techniques. In one embodiment, this may involve solution depositing (or vacuum depositing) a precursor layer (optionally with a desired Cu-to-In-to-Ga ratio), subsequently adding chalcogen (solution-based, vacuum-based, or otherwise such as but not limited to vapor or H2Se, ec . . . ), optionally heat treating this stack (during or after introduction of the chalcogen source), subsequently depositing an additional precursor layer (optionally with a desired Cu-to-In-to-Ga ratio), and finally heat treating the final stack (during or after the introduction of additional chalcogen). The goal is to create planar nucleation so that there are no holes or areas where the substrate will not be covered by subsequent film formation and/or crystal growth. Optionally, the chalcogen source may also be introduced before adding the first precursor layer containing Cu+In+Ga.

Nucleation Layer by Thermal Gradient

Figure 7A:
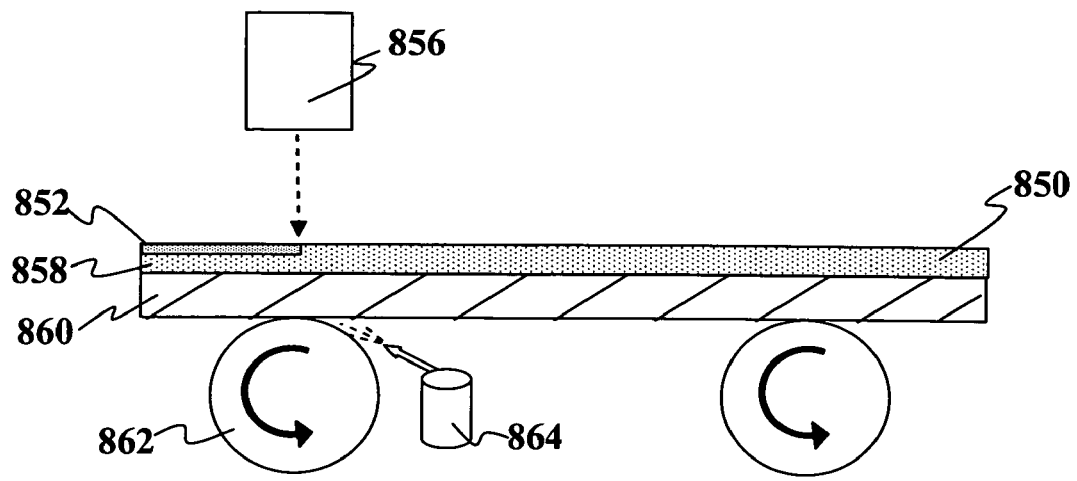
FIGS. 7A-7B show schematics of devices which may be used to create a nucleation layer through a thermal gradient.
Figure 7B:
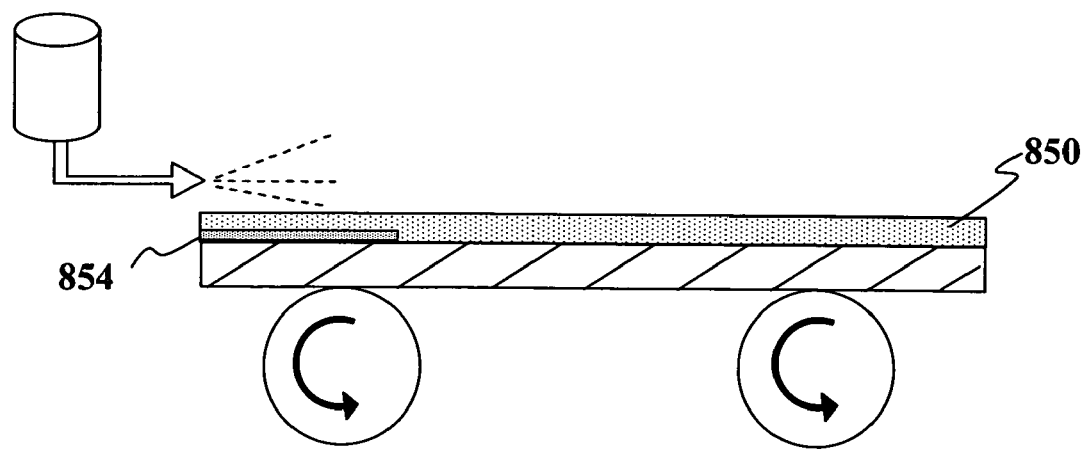

Referring now to FIGS. 7A-7B, it should be understood that a nucleation layer for use with a particle or flake based precursor material or any other precursor material, may also be formed by creating a thermal gradient in the precursor layer 850. As a nonlimiting example, the nucleation layer 852 may be formed at the upper portion of the precursor layer or optionally by forming the nucleation layer 854 at a lower portion of the precursor layer. The nucleation layer 852 or 854 is formed by creating a thermal gradient in the precursor layer such that one portion of the layer reaches a temperature sufficient to begin crystal growth. The nucleation layer may be in the form of a nucleation plane having a substantially planar configuration to promote a more even crystal growth across the substrate while minimizing the formation of pinholes and other anomalies.

As seen in FIG. 7A, in one embodiment of the present invention, the thermal gradient used to form the nucleation layer 852 may be created by using a laser 856 to increase only an upper portion of the precursor layer 850 to a processing temperature. The laser 856 may be pulsed or otherwise controlled to not heat the entire thickness of the precursor layer to a processing temperature. The backside 858 of the precursor layer and the substrate 860 supporting it may be in contact with cooled rollers 862, cooled planar contact surface, or cooled drums which provide an external source of cooling to prevent lower portions of the layer from reaching processing temperature. Cooled gas 864 may also be provided on one side of the substrate and adjacent portion of the precursor layer to lower the temperature of the precursor layer below a processing temperature where nucleation to the final IB-IIIA-chalcogenide compound begins. It should be understood that other devices may be used to heat the upper portion of the precursor layer such as but not limited to pulsed thermal processing, plasma heating, or heating via IR lamps.

Although pulsed thermal processing remains generally promising, certain implementations of the pulsed thermal processing such as a directed plasma arc system, face numerous challenges. In this particular example, a directed plasma arc system sufficient to provide pulsed thermal processing is an inherently cumbersome system with high operational costs. The direct plasma arc system requires power at a level that makes the entire system energetically expensive and adds significant cost to the manufacturing process. The directed plasma arc also exhibits long lag time between pulses and thus makes the system difficult to mate and synchronize with a continuous, roll-to-roll system. The time it takes for such a system to recharge between pulses also creates a very slow system or one that uses more than directed plasma arc, which rapidly increase system costs.

In some embodiments of the present invention, other devices suitable for rapid thermal processing may be used and they include pulsed layers used in adiabatic mode for annealing (Shtyrokov E I, *Sov. Phys.—Semicond.* 9 1309), continuous wave lasers (10-30 W typically) (Ferris S D 1979 *Laser-Solid Interactions and Laser Processing* (New York: AIP)), pulsed electron beam devices (Kamins T I 1979 *Appl. Phys. Leti.* 35 282-5), scanning electron beam systems (McMahon R A 1979 *J. Vac. Sci. Techno.* 16 1840-2) (Regolini J L 1979 *Appl. Phys. Lett.* 34 410), other beam systems (Hodgson R T 1980 *Appl. Phys. Lett.* 37 187-9), graphite plate heaters (Fan J C C 1983 *Mater. Res. Soc. Proc.* 4 751-8) (M W Geis 1980 *Appl. Phys. Lett.* 37 454), lamp systems (Cohen R L 1978 *Appl. Phys. Lett.* 33 751-3), and scanned hydrogen flame systems (Downey D F 1982 *Solid State Technol.* 25 87-93). In some embodiment of the present invention, non-directed, low density system may be used. Alternatively, other known pulsed heating processes are also described in U.S. Pat. Nos. 4,350,537 and 4,356,384. Additionally, it should be understood that methods and apparatus involving pulsed electron beam processing and rapid thermal processing of solar cells as described in expired U.S. Pat. No. 3,950,187 ("Method and apparatus involving pulsed electron beam processing of semiconductor devices") and U.S. Pat. No. 4,082,958 ("Apparatus involving pulsed electron beam processing of semiconductor devices") are in the public domain and well known. U.S. Pat. No. 4,729,962 also describes another known method for rapid thermal processing of solar cells. The above may be applied singly or in single or multiple combinations with other similar processing techniques with various embodiments of the present invention.

As seen in FIG. 7B, in another embodiment of the present invention, the nucleation layer 854 may be formed on a lower portion of the precursor layer 850 using techniques similar to those described above. Since the substrate 860 used with the present invention may be selected to be thermally conductive, underside heating of the substrate will also cause heating of a lower portion of the precursor layer. The nucleation plane will then form along the bottom portion of the lower portion. The upper portion of the precursor layer may be cooled by a variety of techniques such as, but not limited to, cooled gas, cooled rollers, or other cooling device.

After the nucleation layer has formed, preferably consisting of material identical or close to the final IB-IIIA-chalcogenide compound, the entire precursor layer, or optionally only those portions of the precursor layer that remain more or less unprocessed, will be heated to the processing temperature so that the remaining material will begin to convert into the final IB-IIIA-chalcogenide compound in contact with the nucleation layer. The nucleation layer guides the crystal formation and minimizes the possibility of areas of the substrate forming pinhole or having other abnormalities due to uneven crystal formation.

It should be understood that in addition to the aforementioned, the temperature may also vary over different time periods of precursor layer processing. As a nonlimiting example, the heating may occur at a first temperature over an initial processing time period and proceed to other temperatures for subsequent time periods of the processing. Optionally, the method may include intentionally creating one or more temperature dips so that, as a nonlimiting example, the method comprises heating, cooling, heating, and subsequent cooling.

Nucleation Layer by Chemical Gradient

Referring now to FIGS. 8A-8F, a still further method of forming a nucleation layer with a particle or microflake precursor material according to the present invention will be described in more detail. In this embodiment of the present invention, the composition of the deposited layers of precursor material may be selected so that crystal formation begins sooner in some layers than in other layers. It should be understood that the various methods of forming a nucleation layer may be combined together to facilitate layer formation. As a nonlimiting example, the thermal gradient and chemical gradient methods may be combined to facilitate nucleation layer formation. It is imagined that single or multiple combinations of using a thermal gradient, chemical gradient, and/or thin film nucleation layer may be combined.

Referring now to FIG. 8A, the absorber layer may be formed on a substrate 912, as shown in FIG. 8A. A surface of the substrate 912, may be coated with a contact layer 914 to promote electrical contact between the substrate 912 and the absorber layer that is to be formed on it. By way of example, an aluminum substrate 912 may be coated with a contact layer 914 of molybdenum. As discussed herein, forming or disposing a material or layer of material on the substrate 912 includes disposing or forming such material or layer on the contact layer 914, if one is used. Optionally, it should also be understood that a layer 915 may also be formed on top of contact layer 914 and/or directly on substrate 912. This layer may be solution coated, evaporated, and/or deposited using vacuum based techniques. Although not limited to the following, the layer 915 may have a thickness less than that of the precursor layer 916. In one nonlimiting example, the layer may be between about 1 to about 100 nm in thickness. The layer 915 may be comprised of various materials including but not limited to at least one of the following: a group IB element, a group IIIA element, a group VIA element, a group IA element (new style: group 1), a binary and/or multinary alloy of any of the preceding elements, a solid solution of any of the preceding elements, copper, indium, gallium, selenium, copper indium, copper gallium, indium gallium, sodium, a sodium compound, sodium fluoride, sodium indium sulfide, copper selenide, copper sulfide, indium selenide, indium sulfide, gallium selenide, indium gallium sulfide, gallium sulfide, copper indium selenide, copper indium sulfide, copper gallium selenide, copper gallium sulfide, indium gallium selenide, indium gallium sulfide, copper indium gallium selenide, and/or copper indium gallium sulfide.

As shown in FIG. 8B, a precursor layer 916 is formed on the substrate. The precursor layer 916 contains one or more group IB elements and one or more group IIIA elements. Preferably, the one or more group IB elements include copper. The one or more group IIIA elements may include indium and/or gallium. The precursor layer may be formed using any of the techniques described above. In one embodiment, the precursor layer contains no oxygen other than those unavoidably present as impurities or incidentally present in components of the film other than the particles or microflakes themselves. Although the precursor layer 916 is preferably formed using non-vacuum methods, it should be understood that it may optionally be formed by other means, such as evaporation, sputtering, ALD, etc. By way of example, the precursor layer 916 may be an oxygen-free compound containing copper, indium and gallium. In one embodiment, the non-vacuum system operates at pressures above about 3.2 kPa (24 Torr). Optionally, it should also be understood that a layer 917 may also be formed on top of precursor layer 916. It should be understood that the stack may have both layers 915 and 917, only one of the layers, or none of the layers. Although not limited to the following, the layer 917 may have a thickness less than that of the precursor layer 916. In one nonlimiting example, the layer may be between about 1 to about 100 nm in thickness. The layer 917 may be comprised of various materials including but not limited to at least one of the following: a group IB element, a group IIIA element, a group VIA element, a group IA element (new style: group 1), a binary and/or multinary alloy of any of the preceding elements, a solid solution of any of the preceding elements, copper, indium, gallium, selenium, copper indium, copper gallium, indium gallium, sodium, a sodium compound, sodium fluoride, sodium indium sulfide, copper selenide, copper sulfide, indium selenide, indium sulfide, gallium selenide, gallium sulfide, copper indium selenide, copper indium sulfide, copper gallium selenide, copper gallium sulfide, indium gallium selenide, indium gallium sulfide, copper indium gallium selenide, and/or copper indium gallium sulfide.

Referring now to FIG. 8C, a second precursor layer 918 of a second precursor material may optionally be applied on top of the first precursor layer. The second precursor material may have an overall composition that is more chalcogen-rich than the first precursor material in precursor layer 916. As a nonlimiting example, this allows for creating a gradient of available Se by doing two coatings (preferably with only one heating process of the stack after depositing both precursor layer coatings) where the first coating contains selenides with relatively less selenium in it (but still enough) than the second. For instance, the precursor for the first coating can contain $Cu_xSe_y$ where the x is larger than in the second coating. Or it may contain a mix of $Cu_xSe_y$ particles wherein there is a larger concentration (by weight) of the selenide particles with the large x. In this current embodiment, each layer has preferably the targeted stoichiometry because the C/I/G ratios are kept the same for each precursor layer. Again, although this second precursor layer 918 is preferably formed using non-vacuum methods, it should be understood that it may optionally be formed by other means, such as evaporation, sputtering, ALD, etc.

The rationale behind the use of chalcogen grading, or more general a grading in melting temperature from bottom to top, is to control the relative rate of crystallization in depth and to have the crystallization happen e.g. faster at the bottom portion of the stack of precursor layers than at the top of the stack of precursor layers. The additional rationale is that the common grain structure in typical efficient solution-deposited CIGS cells where the cells have large grains at the top of the photoactive film, which is the part of the photoactive film that is mainly photoactive, and small grains at the back, still have appreciable power conversion efficiencies. It should be understood that in other embodiments, a plurality of many layers of different precursor materials may be used to build up a desired gradient of chalcogen, or more general, a desired gradient in melting temperature and/or subsequent solidification into the final IB-IIIA-chalcogenide compound, or even more general, a desired gradient in melting and/or subsequent solidification into the final IB-IIIA-chalcogenide compound, either due to creating a chemical (compositional) gradient, and/or a thermal gradient, in the resulting film. As nonlimiting examples, the present invention may use particles with different melting points such as but not limited to lower melting materials Se, $In_4Se_3$, Ga, and $Cu_1Se_1$, compared to higher melting materials $In_2Se_3$, $Cu_2Se$.

Referring now to FIG. 8C, heat 920 is applied to sinter the first precursor layer 916 and the second precursor layer 918 into a IB-IIIA-chalcogenide compound film 922. The heat 920 may be supplied in a rapid thermal annealing process, e.g., as described above. Specifically, the substrate 912 and precursor layer(s) 916 and/or 918 may be heated from an ambient temperature to a plateau temperature range of between about 200° C. and about 600° C. The temperature is maintained in the plateau range for a period of time ranging between about a fraction of a second to about 60 minutes, and subsequently reduced.

Optionally, as shown in FIG. 8D, it should be understood that a layer 924 containing elemental chalcogen particles may be applied over the precursor layers 916 and/or 918 prior to heating. Of course, if the material stack does not include a second precursor layer, the layer 924 is formed over the precursor layer 916. By way of example, and without loss of generality, the chalcogen particles may be particles of selenium, sulfur or tellurium. Such particles may be fabricated as described above. The chalcogen particles in the layer 924 may be between about 1 nanometer and about 25 microns in size, preferably between 50 nm and 500 nm The chalcogen particles may be mixed with solvents, carriers, dispersants etc. to prepare an ink or a paste that is suitable for wet deposition over the precursor layer 916 and/or 918 to form the layer 924. Alternatively, the chalcogen particles may be prepared for deposition on a substrate through dry processes to form the layer 924.

Optionally, as shown in FIG. 8E, a layer 926 containing an additional chalcogen source, and/or an atmosphere containing a chalcogen source, may optionally be applied to layer 922, particularly if layer 924 was not applied in FIG. 8D. Heat 928 may optionally be applied to layer 922 and the layer 926 and/or atmosphere containing the chalcogen source to heat them to a temperature sufficient to melt the chalcogen source and to react the chalcogen source with the group IB element and group IIIA elements in the precursor layer 922. The heat 928 may be applied in a rapid thermal annealing process, e.g., as described above. The reaction of the chalcogen source with the group IB and IIIA elements forms a compound film 930 of a group IB-IIIA-chalcogenide compound as shown in FIG. 8D Preferably, the group IB-IIIA-chalcogenide compound is of the form $Cu_zIn_{1-x}Ga_xSe_{2(1-y)}S_{2y}$, where $0 \leq x \leq 1$, $0 \leq y \leq 1$, and $0.5 \leq y \leq 1.5$.

Referring still to FIGS. 8A-8F, it should be understood that sodium may also be used with the precursor material to improve the qualities of the resulting film. In a first method, as discussed in regards to FIGS. 8A and 8B, one or more layers of a sodium containing material may be formed above and/or below the precursor layer 916. The formation may occur by solution coating and/or other techniques such as but not limited to sputtering, evaporation, CBD, electroplating, sol-gel based coating, spray coating, chemical vapor deposition (CVD), physical vapor deposition (PVD), atomic layer deposition (ALD), and the like.

Optionally, in a second method, sodium may also be introduced into the stack by sodium doping the microflakes and/or particles in the precursor layer 916. As a nonlimiting example, the microflakes and/or other particles in the precursor layer 916 may be a sodium containing material such as, but not limited to, Cu—Na, In—Na, Ga—Na, Cu—In—Na, Cu—Ga—Na, In—Ga—Na, Na—Se, Cu—Se—Na, In—Se—Na, Ga—Se—Na, Cu—In—Se—Na, Cu—Ga—Se—Na, In—Ga—Se—Na, Cu—In—Ga—Se—Na, Na—S, Cu—S—Na, In—S—Na, Ga—S—Na, Cu—In—S—Na, Cu—Ga—S—Na, In—Ga—S—Na, and/or Cu—In—Ga—S—Na. In one embodiment of the present invention, the amount of sodium in the microflakes and/or other particles may be about 1 at. % or less. In another embodiment, the amount of sodium may be about 0.5 at. % or less. In yet another embodiment, the amount of sodium may be about 0.1 at. % or less. It should be understood that the doped particles and/or flakes may be made by a variety of methods including milling feedstock material with the sodium containing material and/or elemental sodium.

Optionally, in a third method, sodium may be incorporated into the ink itself, regardless of the type of particle, nanoparticle, microflake, and/or nanoflakes dispersed in the ink. As a nonlimiting example, the ink may include microflakes (Na doped or undoped) and a sodium compound with an organic counter-ion (such as but not limited to sodium acetate) and/or a sodium compound with an inorganic counter-ion (such as but not limited to sodium sulfide). It should be understood that sodium compounds added into the ink (as a separate compound), might be present as particles (e.g. nanoparticles), or dissolved. The sodium may be in "aggregate" form of the sodium compound (e.g. dispersed particles), and the "molecularly dissolved" form.

None of the three aforementioned methods are mutually exclusive and may be applied singly or in any single or multiple combination to provide the desired amount of sodium to the stack containing the precursor material. Additionally, sodium and/or a sodium containing compound may also be added to the substrate (e.g. into the molybdenum target). Also, sodium-containing layers may be formed in between one or more precursor layers if multiple precursor layers (using the same or different materials) are used. It should also be understood that the source of the sodium is not limited to those materials previously listed. As a nonlimiting example, basically, any deprotonated alcohol where the proton is replaced by sodium, any deprotonated organic and inorganic acid, the sodium salt of the (deprotonated) acid, sodium hydroxide, sodium acetate, and the sodium salts of the following acids: butanoic acid, hexanoic acid, octanoic acid, decanoic acid, dodecanoic acid, tetradecanoic acid, hexadecanoic acid, 9-hexadecenoic acid, octadecanoic acid, 9-octadecenoic acid, 11-octadecenoic acid, 9,12-octadecadienoic acid, 9,12,15-octadecatrienoic acid, and/or 6,9,12-octadecatrienoic acid.

Optionally, as seen in FIG. 8F, it should also be understood that sodium and/or a sodium compound may be added to the processed chalcogenide film after the precursor layer has been sintered or otherwise processed. This embodiment of the present invention thus modifies the film after CIGS formation. With sodium, carrier trap levels associated with the grain boundaries are reduced, permitting improved electronic properties in the film. A variety of sodium containing materials such as those listed above may be deposited as layer 932 onto the processed film and then annealed to treat the CIGS film.

Additionally, the sodium material may be combined with other elements that can provide a bandgap widening effect. Two elements which would achieve this include gallium and sulfur. The use of one or more of these elements, in addition to sodium, may further improve the quality of the absorber layer. The use of a sodium compound such as but not limited to $Na_2S$, $NaInS_2$, or the like provides both Na and S to the film and could be driven in with an anneal such as but not limited to an RTA step to provide a layer with a bandgap different from the bandgap of the unmodified CIGS layer or film.

Referring now to FIG. 9, embodiments of the invention may be compatible with roll-to-roll manufacturing. Specifically, in a roll-to-roll manufacturing system 1000 a flexible binary chalcogenide nanoparticles (e.g. group IB non-oxide chalcogenides, such as Cu—Se, Cu—S or Cu—Te) and/or group IIIA-chalcogenide nanoparticles (e.g., group IIIA non-oxide chalcogenides, such as Ga(Se, S, Te), In(Se, S, Te) and Al(Se, S, Te). In other embodiments, the microflakes may be non-chalcogenides such as but not limited to group IB and/or IIIA materials like Cu—In, Cu—Ga, and/or In—Ga. If the chalcogen melts at a relatively low temperature (e.g., 220° C. for Se, 120° C. for S) the chalcogen is already in a liquid state and makes good contact with the microflakes. If the microflakes and chalcogen are then heated sufficiently (e.g., at about 375° C.), the chalcogen reacts with the chalcogenides to form the desired IB-IIIA-chalcogenide material.

Referring now to FIGS. 8A-8C, the chalcogenide microflakes 502 and a source of extra chalcogen, e.g., in the form of a powder containing chalcogen particles 504 may be supported on a substrate 501. As a nonlimiting example, the chalcogen particles may be micron- and/or submicron-sized non-oxygen chalcogen (e.g., Se, S or Te) particles, e.g., a few hundred nanometers or less to a few microns in size. The mixture of chalcogenide microflakes 502 and chalcogen particles 504 is placed on the substrate 501 and heated to a temperature sufficient to melt the extra chalcogen particles 504 to form a liquid chalcogen 506 as shown in FIG. 8B. The liquid chalcogen 506 and chalcogenides 502 are heated to a temperature sufficient to react the liquid chalcogen 506 with the chalcogenides 502 to form a dense film of a group IB-IIIA-chalcogenide compound 508 as shown in FIG. 1C. The dense film of group IB-IIIA-chalcogenide compound is then cooled down.

Although not limited to the following, the chalcogenide particles 502 may be obtained starting from a binary chalcogenide feedstock material, e.g., micron size particles or larger. Examples of chalcogenide materials available commercially are listed below in Table I.

TABLE 1

| Chemical | Formula | Typical % Purity |
| --- | --- | --- |
| Aluminum selenide | Al2Se3 | 99.5 |
| Aluminum sulfide | Al2S3 | 98 |
| Aluminum sulfide | Al2S3 | 99.9 |
| Aluminum telluride | Al2Te3 | 99.5 |
| Copper selenide | Cu—Se | 99.5 |
| Copper selenide | Cu2Se | 99.5 |
| Gallium selenide | Ga2Se3 | 99.999 |
| Copper sulfide | Cu2S(may be Cu1.8-2S) | 99.5 |
| Copper sulfide | CuS | 99.5 |
| Copper sulfide | CuS | 99.99 |
| Copper telluride | CuTe(generally Cu1.4Te) | 99.5 |
| Copper telluride | Cu2Te | 99.5 |
| Gallium sulfide | Ga2S3 | 99.95 |
| Gallium sulfide | GaS | 99.95 |
| Gallium telluride | GaTe | 99.999 |
| Gallium telluride | Ga2Te3 | 99.999 |
| Indium selenide | In2Se3 | 99.999 |
| Indium selenide | In2Se3 | 99.99% |
| Indium selenide | In2Se3 | 99.9 |
| Indium selenide | In2Se3 | 99.9 |
| Indium sulfide | InS | 99.999 |
| Indium sulfide | In2S3 | 99.99 |
| Indium telluride | In2Te3 | 99.999 |
| Indium telluride | In2Te3 | 99.999 |

Examples of chalcogen powders and other feedstocks commercially available are listed in Table II below.

TABLE II

| Chemical | Formula | Typical % Purity |
| --- | --- | --- |
| Selenium metal | Se | 99.99 |
| Selenium metal | Se | 99.6 |
| Selenium metal | Se | 99.6 |
| Selenium metal | Se | 99.999 |
| Selenium metal | Se | 99.999 |
| Sulfur | S | 99.999 |
| Tellurium metal | Te | 99.95 |
| Tellurium metal | Te | 99.5 |

Se, there is another way of creating more liquid by going in the "other" direction and using compositions that are less Se-rich (i.e. left on the binary phase diagram). By using a material composition between pure In and $In_4Se_3$ (or between In and $In_1Se_1$ or between In and In6Se7 depending on temperature), pure liquid In can be created at 156° C. and even more liquid at 520° C. (or at a higher temperature when going more Se-rich moving from the eutectic point of ~24.0 wt.-% Se up to $In_1Se_1$). Basically, for a bulk composition less Se-rich than the In—Se eutectic (~24.0 wt.-% Se), all the In—Se will turn into a liquid at 520° C. Of course, with these type of Se poor materials, one of the other particles (such as but not limited to $Cu_1Se_2$ and/or Se) will be needed to increase the Se content, or another source of Se.

Accordingly, liquid may be created at our processing temperature by: 1) adding a separate source of selenium, 2) using Cu—Se more Se-rich than $Cu_2$-xSe, 3) using Ga-emulsion (or In—Ga emulsion), or In (in an air free environment), or 4) using In—Se less Se-rich than In1Se1 though this may also require an air free environment. When copper selenide is used, the composition may be $Cu_xSe_y$, wherein x is in the range of about 2 to about 1 and y is in the range of about 1 to about 2. When indium selenide is used, the composition may be $In_xSe_y$, wherein x is in the range of about 1 to about 6 and y is in the range of about 0 to about 7. When gallium selenide is used, the composition may be $Ga_xSe_y$, wherein x is in the range of about 1 to about 2 and y is in the range of about 1 to about 3.

It should be understood that adding a separate source of selenium will make the composition behave initially as more Se-rich at the interface of the selenide particle and the liquid selenium at the processing temperature.

Chalcogen Vapor Environment

Figure 10A:
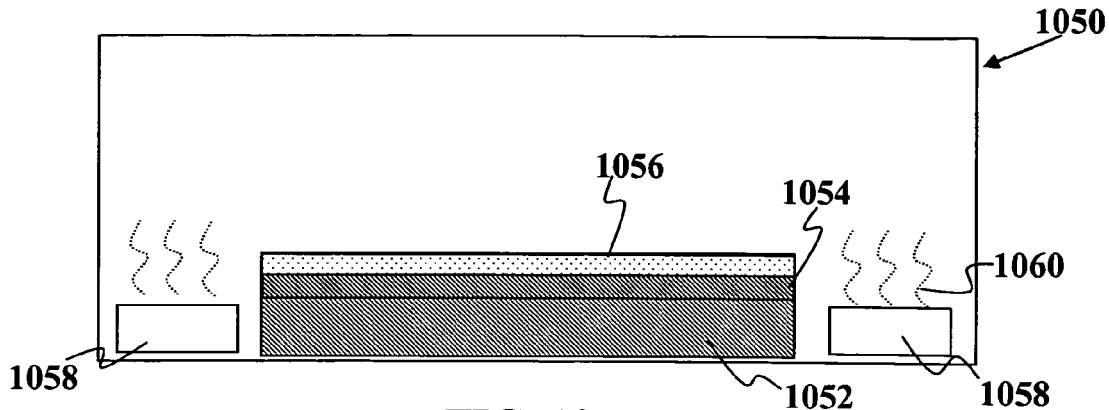
FIG. 10A shows a schematic of a system using a chalcogen vapor environment according to one embodiment of the present invention.
Figure 10B:
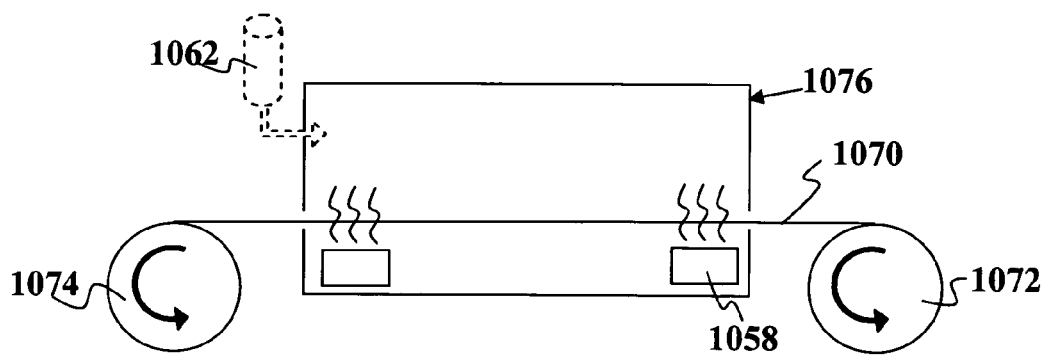
FIG. 10B shows a schematic of a system using a chalcogen vapor environment according to one embodiment of the present invention.

Referring now to FIG. 10A, yet another embodiment of the present invention will now be described. In this embodiment for use with a particle and/or microflake precursor material, it should be understood that overpressure from chalcogen vapor is used to provide a chalcogen atmosphere to improve processing of the film and crystal growth. FIG. 10A shows a chamber 1050 with a substrate 1052 having a contact layer 1054 and a precursor layer 1056. Extra sources 1058 of chalcogen are included in the chamber and are brought to a temperature to generate chalcogen vapor as indicated by lines 1060. In one embodiment of the present invention, the chalcogen vapor is provided to have a partial pressure of the chalcogen present in the atmosphere greater than or equal to the vapor pressure of chalcogen that would be required to maintain a partial chalcogen pressure at the processing temperature and processing pressure to minimize loss of chalcogen from the precursor layer, and if desired, provide the precursor layer with additional chalcogen. The partial pressure is determined in part on the temperature that the chamber 1050 or the precursor layer 1056 is at. It should also be understood that the chalcogen vapor is used in the chamber 1050 at a non-vacuum pressure. In one embodiment, the pressure in the chamber is at about atmospheric pressure. Per the ideal gas law PV=nRT, it should be understood that the temperature influences the vapor pressure. In one embodiment, this chalcogen vapor may be provided by using a partially or fully enclosed chamber with a chalcogen source 1062 therein or coupled to the chamber. In another embodiment using a more open chamber, the chalcogen overpressure may be provided by supplying a source producing a chalcogen vapor. The chalcogen vapor may serve to help keep the chalcogen in the film. Thus, the chalcogen vapor may or may not be used to provide excess chalcogen. It may serve more to keep the chalcogen present in the film than to provide more chalcogen into the film.

Referring now to FIG. 10B, it shown that the present invention may be adopted for use with a roll-to-roll system where the substrate 1070 carrying the precursor layer may be flexible and configured as rolls 1072 and 1074. The chamber 1076 may be at vacuum or non-vacuum pressures. The chamber 1076 may be designed to incorporate a differential valve design to minimize the loss of chalcogen vapor at the chamber entry and chamber exit points of the roll-to-roll substrate 1070.

Figure 10C:
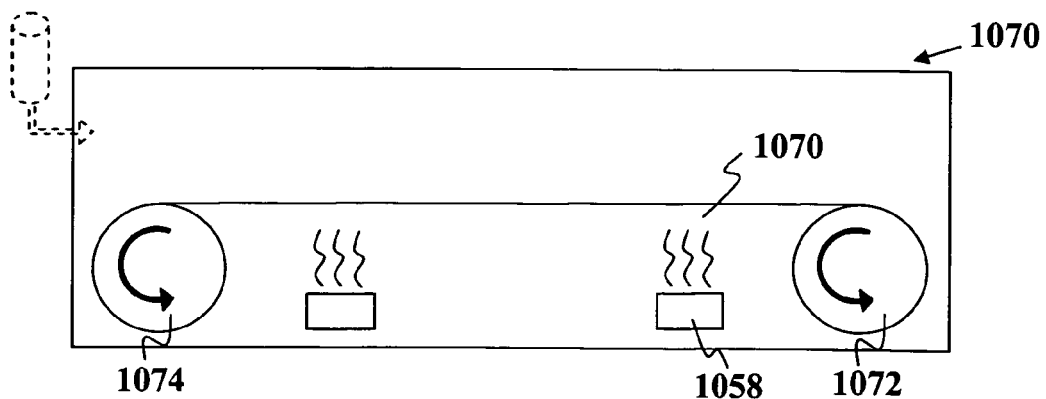
FIG. 10C shows a schematic of a system using a chalcogen vapor environment according to one embodiment of the present invention.

Referring now to FIG. 10C, yet another embodiment of the present invention uses a chamber 1090 of sufficient size to hold the entire substrate, including any rolls 1072 or 1074 associated with using a roll-to-roll configuration.

Figure 11A:
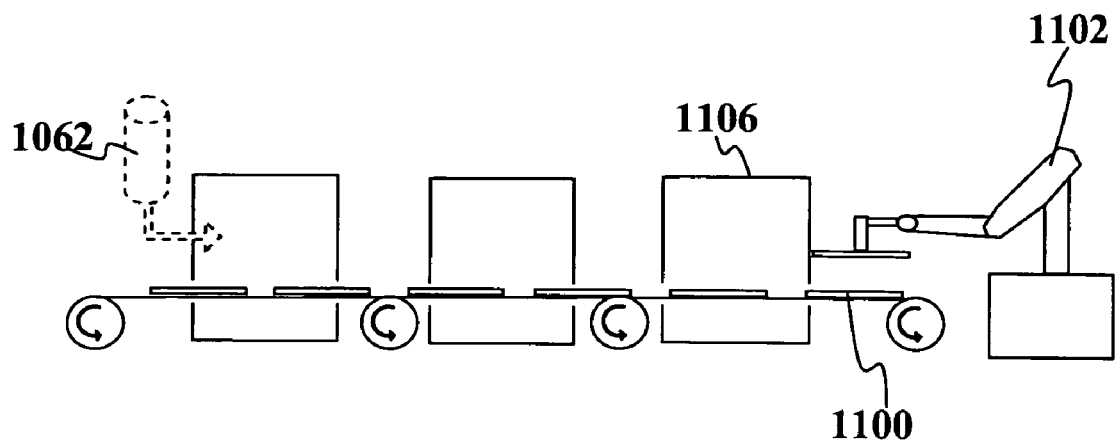
FIG. 11A shows one embodiment of a system for use with rigid substrates according to one embodiment of the present invention.

Referring now to FIG. 11A, it should also be understood that the embodiments of the present invention may also be used on a rigid substrate 1100. By way of nonlimiting example, the rigid substrate 1100 may be glass, soda-lime glass, steel, stainless steel, aluminum, polymer, ceramic, coated polymer, plates, metallized ceramic plates, metallized polymer plates, metallized glass plates, or other rigid material suitable for use as a solar cell substrate and/or any single or multiple combination of the aforementioned. A high speed pick-and-place robot 1102 may be used to move rigid substrates 1100 onto a processing area from a stack or other storage area. In FIG. 10A, the substrates 1100 are placed on a conveyor belt which then moves them through the various processing chambers. Optionally, the substrates 1100 may have already undergone some processing by the time and may already include a precursor layer on the substrate 1100. Other embodiments of the invention may form the precursor layer as the substrate 1100 passes through the chamber 1106.

Figure 11B:
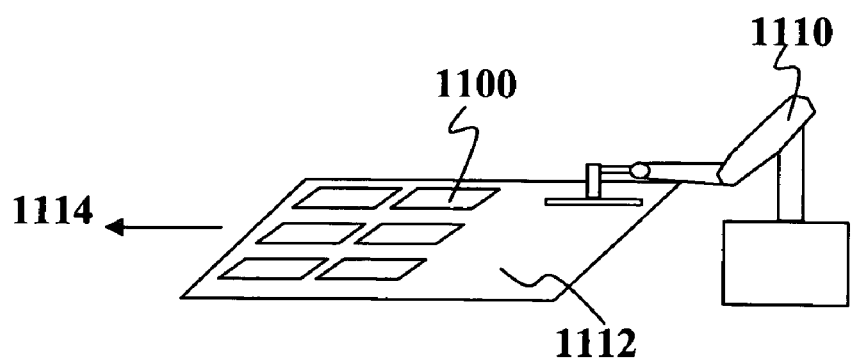
FIG. 11B shows one embodiment of a system for use with rigid substrates according to one embodiment of the present invention.

FIG. 11B shows another embodiment of the present system where a pick-and-place robot 1110 is used to position a plurality of rigid substrates on a carrier device 1112 which may then be moved to a processing area as indicated by arrow 1114. This allows for multiple substrates 1100 to be loaded before they are all moved together to undergo processing.

Figure 12:
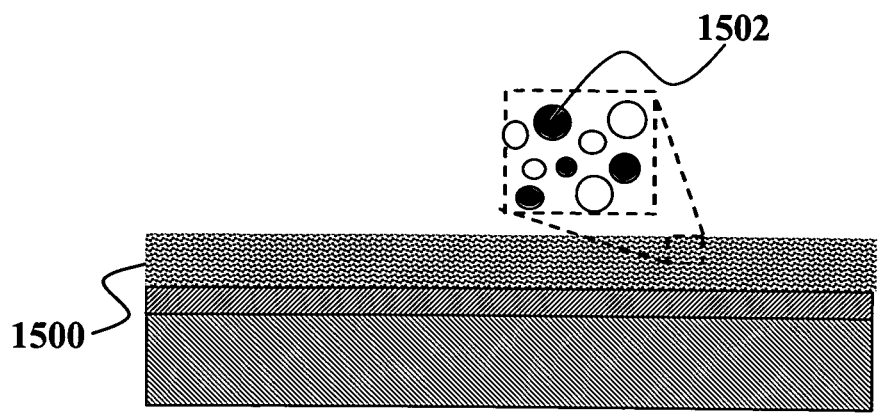
FIGS. 12-14 show the use of inter-metallic material to form a film according to embodiments of the present invention.

Referring now to FIG. 12, yet another embodiment of the present invention will now be described. In one embodiment, the particles used to form a precursor layer 1500 may include particles that are inter-metallic particles 1502. In one embodiment, an inter-metallic material is a material containing at least two elements, wherein the amount of one element in the inter-metallic material is less than about 50 molar percent of the total molar amount of the inter-metallic material and/or the total molar amount of that one element in a precursor material. The amount of the second element is variable and may range from less than about 50 molar percent to about 50 or more molar percent of the inter-metallic material and/or the total molar amount of that one element in a precursor material. Alternatively, inter-metallic phase materials may be comprised of two or more metals where the materials are admixed in a ratio between the upper bound of the terminal solid solution and an alloy comprised of about 50% of one of the elements in the inter-metallic material. The particle distribution shown in the enlarged view of FIG. 12 is purely exemplary and is nonlimiting. It should be understood that some embodiments may have particles that all contain inter-metallic materials, mixture of metallic and inter-metallic materials, metallic particles and inter-metallic particles, or combinations thereof.

It should be understood that inter-metallic phase materials are compounds and/or intermediate solid solutions containing two or more metals, which have characteristic properties and crystal structures different from those of either the pure metals or the terminal solid solutions. Inter-metallic phase materials arise from the diffusion of one material into another via crystal lattice vacancies made available by defects, contamination, impurities, grain boundaries, and mechanical stress. Upon two or more metals diffusing into one another, intermediate metallic species are created that are combinations of the two materials. Sub-types of inter-metallic compounds include both electron and interstitial compounds.

Electron compounds arise if two or more mixed metals are of different crystal structure, valency, or electropositivity relative to one another; examples include but are not limited to copper selenide, gallium selenide, indium selenide, copper telluride, gallium telluride, indium telluride, and similar and/or or related materials and/or blends or mixtures of these materials.

Interstitial compounds arise from the admixture of metals or metals and non-metallic elements, with atomic sizes that are similar enough to allow the formation of interstitial crystal structures, where the atoms of one material fit into the spaces between the atoms of another material. For inter-metallic materials where each material is of a single crystal phase, two materials typically exhibit two diffraction peaks, each representative of each individual material, superimposed onto the same spectra. Thus inter-metallic compounds typically contain the crystal structures of both materials contained within the same volume. Examples include but are not limited to Cu—Ga, Cu—In, and similar and/or related materials and/or blends or mixtures of these materials, where the compositional ratio of each element to the other places that material in a region of its phase diagram other than that of the terminal solid solution.

Inter-metallic materials are useful in the formation of precursor materials for CIGS photovoltaic devices in that metals interspersed in a highly homogenous and uniform manner amongst one another, and where each material is present in a substantially similar amount relative to the other, thus allowing for rapid reaction kinetics leading to high quality absorber films that are substantially uniform in all three dimensions and at the nano-, micro, and meso-scales.

In the absence of the addition of indium nanoparticles, which are difficult to synthesize and handle, terminal solid solutions do not readily allow a sufficiently large range of precursor materials to be incorporated into a precursor film in the correct ratio (e.g. Cu/(In+Ga)=0.85) to provide for the formation of a highly light absorbing, photoactive absorber layer. Furthermore, terminal solid solutions may have mechanical properties that differ from those of inter-metallic materials and/or intermediate solid solutions (solid solutions between a terminal solid solution and/or element). As a nonlimiting example, some terminal solid solutions are not brittle enough to be milled for size reduction. Other embodiments may be too hard to be milled. The use of inter-metallic materials and/or intermediate solid solutions can address some of these drawbacks.

The advantages of particles 1502 having an inter-metallic phase are multi-fold. As a nonlimiting example, a precursor material suitable for use in a thin film solar cell may contain group IB and group IIIA elements such as copper and indium, respectively. If an inter-metallic phase of Cu—In is used such as $Cu_1In_2$, then Indium is part of an In-rich Cu material and not added as pure indium. Adding pure indium as a metallic particle is challenging due to the difficulty in achieving In particle synthesis with high yield, small and narrow nanoparticle size distribution, and requiring particle size discrimination, which adds further cost. Using inter-metallic In-rich Cu particles avoids pure elemental In as a precursor material. Additionally, because the inter-metallic material is Cu poor, this also advantageously allows Cu to be added separately to achieve precisely the amount of Cu desired in the precursor material. The Cu is not tied to the ratio fixed in alloys or solid solutions that can be created by Cu and In. The inter-metallic material and the amount of Cu can be fine tuned as desired to reach a desired stoichiometric ratio. Ball milling of these particles results in no need for particle size discrimination, which decreases cost and improves the throughput of the material production process.

In some specific embodiments of the present invention, having an inter-metallic material provides a broader range of flexibility. Since economically manufacturing elemental indium particles is difficult, it would be advantageous to have an indium-source that is more economically interesting. Additionally, it would be advantageous if this indium source still allows varying both the Cu/(In+Ga) and Ga/(In+Ga) in the layer independently of each other. As one nonlimiting example, a distinction can be made between $Cu_{11}In_9$ and $Cu_1In_2$ with an inter-metallic phase. This particularly true if only one layer of precursor material is used. If, for this particular example, if indium is only provided by $Cu_{11}In_9$, there is more restriction what stoichiometric ratio can be created in a final group IB-IIIA-VIA compound. With $Cu_1In_2$ as the only indium source, however, there is much greater range of ratio can be created in a final group IB-IIIA-VIA compound. $Cu_1In_2$ allows you to vary both the Cu/(In+Ga) and Ga/(In+Ga) independently in a broad range, whereas Cu11In9 does not. For instance, Cu11In9 does only allow for Ga/(In+Ga)= 0.25 with Cu/(In+Ga)>0.92. Yet another example, Cu11In9 does only allow for Ga/(In+Ga)=0.20 with Cu/(In+Ga)>0.98. Yet another example, Cu11In9 does only allow for Ga/(In+Ga)=0.15 with Cu/(In+Ga)>1.04. Thus for an intermetallic material, particularly when the intermetallic material is a sole source of one of the elements in the final compound, the final compound may be created with stoichiometric ratios that more broadly explore the bounds of Cu/(In+Ga) with a compositional range of about 0.7 to about 1.0, and Ga/(In+Ga) with a compositional range of about 0.05 to about 0.3 In other embodiments, Cu/(In+Ga) compositional range may be about 0.01 to about 1.0. In other embodiments, the Cu/(In+Ga) compositional range may be about 0.01 to about 1.1. In other embodiments, the Cu/(In+Ga) compositional range may be about 0.01 to about 1.5. This typically results in additional $Cu_xSe_y$, which we might be able to remove afterwards if it is at the top surface. It should be understood that these ratios may apply to any of the above embodiments described herein.

Furthermore, it should be understood that during processing, an intermetallic material may create more liquid than other compounds. As a nonlimiting example, $Cu_1In_2$ will form more liquid when heated during processing than Cu11In9. More liquid promotes more atomic intermixing since it easier for material to move and mix while in a liquid stage.

Additionally, there are specific advantages for particular types of inter-metallic particles such as, but not limited to, $Cu_1In_2$. $Cu_1In_2$ is a material that is metastable. The material is more prone to decomposition, which advantageously for the present invention, will increase the rate of reaction (kinetically). Further, the material is less prone to oxidation (e.g. compared to pure In) and this further simplifies processing. This material may also be single-phase, which would make it more uniform as a precursor material, resulting in better yield.

Figure 13:
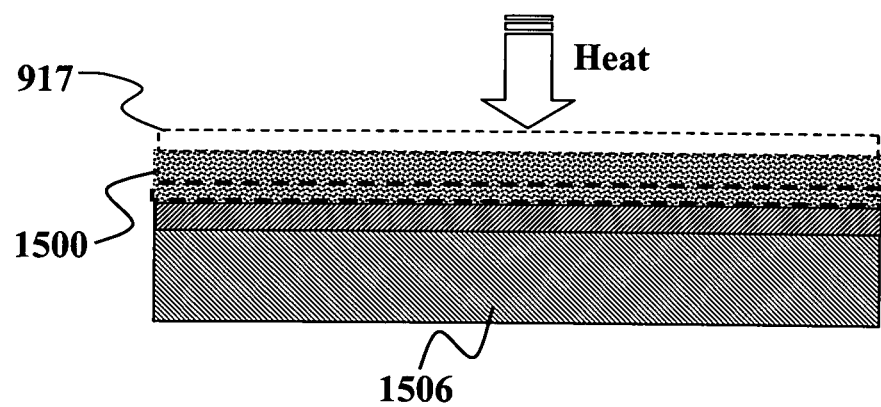
Figure 14:
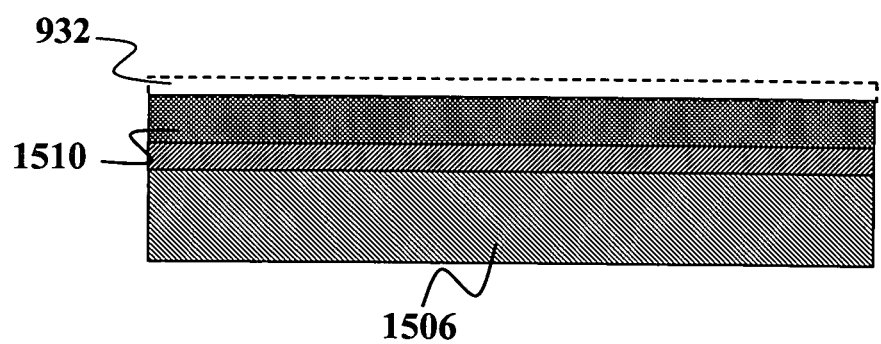

As seen in FIGS. 13 and 14, after the layer 1500 is deposited over the substrate 1506, it may then be heated in a suitable atmosphere to react the layer 1500 in FIG. 13 and form film 1510 shown in FIG. 14. It should be understood that the layer 1500 may be used in conjunction with layers 915 and 917 as described above with regards to FIG. 8A-8B. The layer 915 may be comprised of various materials including but not limited at least one of the following: a group IB element, a group IIIA element, a group VIA element, a group IA element (new style: group 1), a binary and/or multinary alloy of any of the preceding elements, a solid solution of any of the preceding elements. It should be understood that sodium or a sodium-based material such as but not limited to sodium, a sodium compound, sodium fluoride, and/or sodium indium sulfide, may also be used in layer 915 with the precursor material to improve the qualities of the resulting film. FIG. 14 shows that a layer 932 may also be used as described with regards to FIG. 8F. Any of the method suggested previously with regards to sodium content may also be adapted for use with the embodiments shown in FIGS. 13-14.

It should be understood that other embodiments of the present invention also disclose material comprised of at least two elements wherein the amount of at least one element in the material is less than about 50 molar percent of the total molar amount of that element in the precursor material. This includes embodiments where the amount of group IB element is less than the amount of group IIIA element in inter-metallic material. As a nonlimiting example, this may include other group IB poor, group IB-IIIA materials such as Cu-poor $Cu_xIn_y$ particles (where x<y). The amount of group IIIA material may be in any range as desired (more than about 50 molar percent of the element in the precursor material or less than 50 molar percent). In another nonlimiting example, $Cu_1Ga_2$ may be used with elemental Cu and elemental In. Although this material is not an inter-metallic material, this material is a intermediate solid solution and is different from a terminal solid solution. All solid particles are created based on a $Cu_1Ga_2$ precursor. In this embodiment, no emulsions are used.

In still other embodiments of the present invention, other viable precursor materials may be formed using a group IB rich, group IB-IIIA material. As a nonlimiting example, a variety of intermediate solid-solutions may be used. Cu—Ga (38 at % Ga) may be used in precursor layer 1500 with elemental indium and elemental copper. In yet another embodiment, Cu—Ga (30 at % Ga) may be used in precursor layer 1500 with elemental copper and elemental indium. Both of these embodiments describe Cu-rich materials with the Group IIIA element being less than about 50 molar percent of that element in the precursor material. In still further embodiments, Cu—Ga (multiphasic, 25 at % Ga) may be used with elemental copper and indium to form the desired precursor layer. It should be understood that nanoparticles of these materials may be created by mechanical milling or other size reduction methods. In other embodiments, these particles may be made by electroexplosive wire (EEW) processing, evaporation condensation (EC), pulsed plasma processing, or other methods. Although not limited to the following, the particles sizes may be in the range of about 10 nm to about 1 micron. They may be of any shape as described herein.

Figure 15:
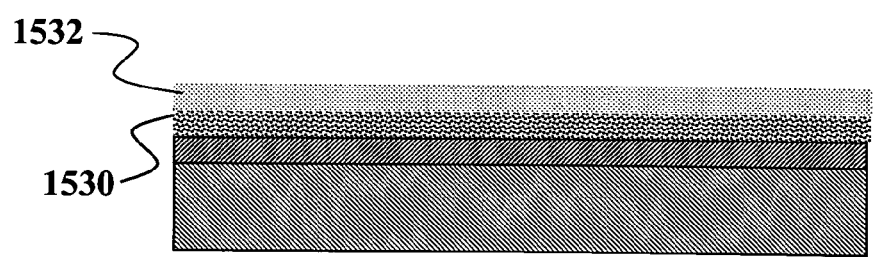
FIG. 15 is a cross-sectional view showing the use of multiple layers to form a film according to embodiments of the present invention.

Referring now to FIG. 15, in a still further embodiment of the present invention, two or more layers of materials may be coated, printed, or otherwise formed to provide a precursor layer with the desired stoichiometric ratio. As a nonlimiting example, layer 1530 may contain a precursor material having $Cu_{11}In_9$ and a Ga source such as elemental Ga and/or $Ga_xSe_y$. A copper rich precursor layer 1532 containing $Cu_{78}In_{28}$ (solid-solution) and elemental indium or $In_xSe_y$, may be printed over layer 1530. In such an embodiment, the resulting overall ratios may have Cu/(In+Ga)=0.85 and Ga/(In+Ga) 0.19. In one embodiment of the resulting film, the film may have a stoichiometric ratio of Cu/(In+Ga) with a compositional range of about 0.7 to about 1.0 and Ga/(In+Ga) with a compositional range of about 0.05 to about 0.3.

Figure 16:
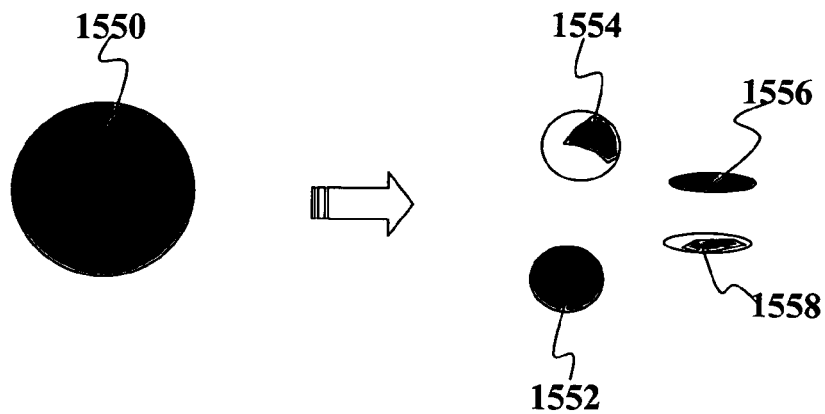
FIG. 16 shows feedstock material being processed according to embodiments of the present invention.

Referring now to FIG. 16, it should be understood that in some embodiments of the present invention, the inter-metallic material is used as a feedstock or starting material from which particles and/or nanoparticles may be formed. As a nonlimiting example, FIG. 21 shows one inter-metallic feedstock particle 1550 being processed to form other particles. Any method used for size reduction and/or shape change may be suitable including but not limited to milling, EEW, EC, pulsed plasma processing, or combinations thereof. Particles 552, 554, 556, and 558 may be formed. These particles may be of varying shapes and some may contain only the inter-metallic phase while others may contain that phase and other material phases.

While the invention has been described and illustrated with reference to certain particular embodiments thereof those skilled in the art will appreciate that various adaptations, changes, modifications, substitutions, deletions, or additions of procedures and protocols may be made without departing from the spirit and scope of the invention. For example, still other embodiments of the present invention may use a Cu—In precursor material wherein Cu—In contribute less than about 50 percent of both Cu and In found in the precursor material. The remaining amount is incorporated by elemental form or by non IB-IIIA alloys. Thus, a $Cu_{11}In_9$ may be used with elemental Cu, In, and Ga to form a resulting film. In another embodiment, instead of elemental Cu, In, and Ga, other materials such as Cu—Se, In—Se, and/or Ga—Se may be substituted as source of the group IB or IIIA material. Optionally, in other embodiment, the IB source may be any particle that contains Cu without being alloyed with In and Ga (Cu, Cu—Se). The IIIA source may be any particle that contains In without Cu (In—Se, In—Ga—Se) or any particle that contains Ga without Cu (Ga, Ga—Se, or In—Ga—Se). Other embodiments may have these combinations of the IB material in a nitride or oxide form. Still other embodiments may have these combinations of the IIIA material in a nitride or oxide form. The present invention may use any combination of elements and/or selenides (binary, ternary, or multinary) may be used. Optionally, some other embodiments may use oxides such as $In_2O_3$ to add the desired amounts of materials. It should be understood for any of the above embodiments that more than one solid solution may be used, multi-phasic alloys, and/or more general alloys may also be used. For any of the above embodiments, the annealing process may also involve exposure of the compound film to a gas such as $H_2$, CO, $N_2$, Ar, $H_2Se$, or Se vapor.

It should also be understood that several intermediate solid solutions may also be suitable for use according to the present invention. As nonlimiting examples, a composition in the δ phase for Cu—In (about 42.52 to about 44.3 wt % In) and/or a composition between the δ phase for Cu—In and $Cu_{16}In_9$ may be suitable inter-metallic materials for use with the present invention to form a group IB-IIIA-VIA compound. It should be understood that these inter-metallic materials may be mixed with elemental or other materials such as Cu—Se, In—Se, and/or Ga—Se to provide sources of the group IB or IIIA material to reach the desired stoichiometric ratios in the final compound. Other nonlimiting examples of inter-metallic material include compositions of Cu—Ga containing the following phases: $\gamma_1$ (about 31.8 to about 39.8 wt % Ga), $\gamma_2$ (about 36.0 to about 39.9 wt % Ga), $\gamma_3$ (about 39.7 to about −44.9 wt % Ga), the phase between $\gamma_2$ and $\gamma_3$, the phase between the terminal solid solution and $\gamma_1$, and θ (about 66.7 to about 68.7 wt % Ga). For Cu—Ga, a suitable composition is also found in the range in between the terminal solid-solution of and the intermediate solid-solution next to it. Advantageously, some of these inter-metallic materials may be multi-phasic which are more likely to lead to brittle materials that can be mechanically milled. Phase diagrams for the following materials may be found in ASM Handbook, Volume 3 Alloy Phase Diagrams (1992) by ASM International and fully incorporated herein by reference for all purposes. Some specific examples (fully incorporated herein by reference) may be found on pages 2-168, 2-170, 2-176, 2-178, 2-208, 2-214, 2-257, and/or 2-259.

For example, with any of the above embodiments, it should be understood that any of the above particles may be spherical, spheroidal, or other shaped. For any of the above embodiments, it should be understood that the use of core-shell particles and printed layers of a chalcogen source may be combined as desired to provide excess amounts of chalcogen. The layer of the chalcogen source may be above, below, or mixed with the layer containing the core-shell particles.

For any of the above embodiments, it should be understood that in addition to the aforementioned, the temperature may also vary over different time periods of precursor layer processing. As a nonlimiting example, the heating may occur at a first temperature over an initial processing time period and proceed to other temperatures for subsequent time periods of the processing. Optionally, the method may include intentionally creating one or more temperature dips so that, as a nonlimiting example, the method comprises heating, cooling, heating, and subsequent cooling. In one embodiment, the dip may be between about 50 to 200 degrees C. from the initial processing temperature. It should also be understood that some embodiments of the present invention may provide sufficient chalcogen vapor pressure so that particles leaving the liquid in the precursor layer during processing is replaced by particles in the surrounding atmosphere. In yet another embodiment, there is sufficient vapor pressure so that the loss from the liquid chalcogen in the precursor layer is less than about 1 wt % of the total amount of chalcogen in the precursor layer. In yet another embodiment, there is sufficient vapor pressure so that the loss from the liquid chalcogen in the precursor layer is less than about 5 wt % of the total amount of chalcogen in the precursor layer. In yet another embodiment, there is sufficient vapor pressure so that the loss from the liquid chalcogen in the precursor layer is less than about 10 wt % of the total amount of chalcogen in the precursor layer. In yet another embodiment, there is sufficient vapor pressure so that the loss from the liquid chalcogen in the precursor layer is less than about 20 wt % of the total amount of chalcogen in the precursor layer. The suitable atmosphere may contain selenium, sulfur, tellurium, $H_2$, CO, $H_2Se$, $H_2S$, Ar, $N_2$, and/or combinations or blends of these. It should be understood that evaporation or printing may also be used to add Se to the stack of layers for processing.

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited. The following related applications are fully incorporated herein by reference for all purposes: U.S. patent application Ser. No. 11/361,522, U.S. patent application Ser. No. 11/361,515, U.S. patent application Ser. No. 11/361,464, U.S. patent application Ser. No. 11/361,523, and U.S. patent application Ser. No. 11/361,103, all filed on Feb. 23, 2006. The following applications are also incorporated herein by reference for all purposes: U.S. patent application Ser. No. 11/290,633 entitled "CHALCOGENIDE SOLAR CELLS" filed Nov. 29, 2005, U.S. patent application Ser. No. 10/782,017, entitled "SOLUTION-BASED FABRICATION OF PHOTOVOLTAIC CELL" filed Feb. 19, 2004, U.S. patent application Ser. No. 10/943,657, entitled "COATED NANOPARTICLES AND QUANTUM DOTS FOR SOLUTION-BASED FABRICATION OF PHOTOVOLTAIC CELLS" filed Sep. 18, 2004, U.S. patent application Ser. No. 11/081,163, entitled "METALLIC DISPERSION", filed Mar. 16, 2005, and U.S. patent application Ser. No. 10/943,685, entitled "FORMATION OF CIGS ABSORBER LAYERS ON FOIL SUBSTRATES", filed Sep. 18, 2004, the entire disclosures of which are incorporated herein by reference. Copending U.S. patent application Ser. No. 11/396,199 filed Mar. 30, 2006 is also fully incorporated herein by reference for all purposes.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method comprising:
   forming a precursor material comprising group IB-chalcogenide and/or group IIIA-chalcogenide particles;
   forming a precursor layer of the precursor material over a surface of a substrate; and
   heating the particle precursor material in a substantially oxygen-free chalcogen atmosphere to a processing temperature sufficient to react the particles and to release chalcogen from the chalcogenide particles, wherein the chalcogen assumes a liquid form and acts as a flux to improve intermixing of elements to form a group IB-IIIA-chalcogenide film at a desired stoichiometric ratio;
   wherein the chalcogen atmosphere provides a partial pressure greater than or equal to the vapor pressure of liquid chalcogen in the precursor layer at the processing temperature;
   wherein at least one set of the particles in the precursor material are inter-metallic particles containing at least one group IB-IIIA inter-metallic alloy phase.

2. The process of claim 1 wherein the film includes a group IB-IIIA-VIA compound.

3. The process of claim 1 wherein reacting comprises heating the layer in the suitable atmosphere.

4. The process of claim 1 wherein at least one set of the particles in the group IB-chalcogenide and/or group IIIA-chalcogenide particles is in the form of nanoglobules.

5. The process of claim 1 wherein at least one set of the particles in the group IB-chalcogenide and/or group IIIA-chalcogenide particles are in the form of nanoglobules and contain at least one group IIIA element.

6. The process of claim 1 wherein at least one set of the particles in the group IB-chalcogenide and/or group IIIA-chalcogenide particles is in the form of nanoglobules comprising of a group IIIA element in elemental form.

7. The process of claim 1 wherein the inter-metallic phase is not a terminal solid solution phase.

8. The process of claim 1 wherein the inter-metallic phase is not a solid solution phase.

9. The process of claim 1 wherein inter-metallic particles contribute less than about 50 molar percent of group IB elements found in all of the particles.

10. The process of claim 1 wherein inter-metallic particles contribute less than about 50 molar percent of group IIIA elements found in all of the particles.

11. The process of claim 1 wherein inter-metallic particles contribute less than about 50 molar percent of the group IB elements and less than about 50 molar percent of the group IIIA elements in the precursor layer.

12. The process of claim 1 wherein inter-metallic particles contribute less than about 50 molar percent of the group IB elements and more than about 50 molar percent of the group IIIA elements in the precursor layer.

13. The process of claim 1 wherein inter-metallic particles contribute more than about 50 molar percent of the group IB elements and less than about 50 molar percent of the group IIIA elements in the precursor layer.

14. The process of claim 10 wherein the molar percent is based on a total molar mass of the elements in all particles present in the precursor layer.

15. The process of claim 1 wherein at least some of the particles have a platelet shape.

16. The process of claim 1 wherein a majority of the particles have a platelet shape.

17. The process of claim 1 wherein all of the particles have a platelet shape.

18. The process of claim 1 wherein forming the precursor layer comprises coating the substrate with a dispersion containing IB-chalcogenide and/or group IIIA-chalcogenide particles.

19. The process of claim 18 wherein the dispersion comprises an emulsion.

20. The process of claim 1 wherein the inter-metallic material is a binary material.

21. The process of claim 1 wherein the inter-metallic material is a ternary material.

22. The process of claim 1 wherein the inter-metallic material comprises $Cu_1In_2$.

23. The process of claim 1 wherein the inter-metallic material comprises a composition in a δ phase of $Cu_1In_2$.

24. The process of claim 1 wherein the inter-metallic material comprises a composition in between a δ phase of $Cu_1In_2$ and a phase defined by $Cu_{16}In_9$.

25. The process of claim 1 wherein the inter-metallic material comprises $Cu_1Ga_2$.

26. The process of claim 1 wherein the inter-metallic material comprises an intermediate solid-solution of $Cu_1Ga_2$.

27. The process of claim 1 wherein the inter-metallic material comprises $Cu_{68}Ga_{38}$.

28. The process of claim 1 wherein the inter-metallic material comprises $Cu_{70}Ga_{30}$.

29. The process of claim 1 wherein the inter-metallic material comprises $Cu_{75}Ga_{25}$.

30. The process of claim 1 wherein the inter-metallic material comprises a composition of Cu—Ga of a phase in between the terminal solid-solution and an intermediate solid-solution next to it.

31. The process of claim 1 wherein the inter-metallic comprises a composition of Cu—Ga in a $\gamma_1$ phase (about 31.8 to about 39.8 wt % Ga).

32. The process of claim 1 wherein the inter-metallic comprises a composition of Cu—Ga in a $\gamma_2$ phase (about 36.0 to about 39.9 wt % Ga).

33. The process of claim 1 wherein the inter-metallic comprises a composition of Cu—Ga in a $\gamma_3$ phase (about 39.7 to about −44.9 wt % Ga).

34. The process of claim 1 wherein the inter-metallic comprises a composition of Cu—Ga in a $\theta$ phase (about 66.7 to about 68.7 wt % Ga).

35. The process of claim 1 wherein the inter-metallic comprises a composition of Cu—Ga in a phase between $\gamma_2$ and $\gamma_3$.

36. The process of claim 1 wherein the inter-metallic comprises a composition of Cu—Ga in a phase between the terminal solid solution and $\gamma_1$.

37. The process of claim 1 wherein the inter-metallic material comprises Cu-rich Cu—Ga.

38. The process of claim 1 wherein gallium is incorporated as a group IIIA element in the form of a suspension of nanoglobules.

39. The process of claim 38 wherein nanoglobules of gallium are formed by creating an emulsion of liquid gallium in a solution.

40. The process of claim 38 wherein gallium is quenched below room temperature.

41. The process of claim 38 further comprising maintaining or enhancing a dispersion of liquid gallium in solution by stirring, mechanical means, electromagnetic means, ultrasonic means, and/or the addition of dispersants and/or emulsifiers.

42. The process of claim 1 further comprising adding a mixture of one or more elemental particles selected from: aluminum, tellurium, or sulfur.

43. The process of claim 1 wherein the suitable atmosphere contains at least one of the following: selenium, sulfur, tellurium, $H_2$, CO, $H_2Se$, $H_2S$, Ar, $N_2$ or combinations or mixture thereof.

44. The process of claim 1 wherein the suitable atmosphere contains at least one of the following: $H_2$, CO, Ar, and $N_2$.

45. The process of claim 1 wherein one or more classes of the particles are doped with one or more inorganic materials.

46. The process of claim 1, wherein one or more classes of the particles are doped with one or more inorganic materials chosen from the group of aluminum (Al), sulfur (S), sodium (Na), potassium (K), or lithium (Li).

47. The process of claim 1 wherein the particles are nanoparticles.

48. The process of claim 1 further comprising forming the particles from a feedstock having an inter-metallic phase.

49. The process of claim 1 further comprising forming the particles from a feedstock having an inter-metallic phase and nanoparticles are formed by one of the following processes: milling, electroexplosive wire (EEW) processing, evaporation condensation (EC), pulsed plasma processing, or combinations thereof.

50. The method of claim 1 wherein the chalcogen atmosphere is comprised of at least selenium.

51. The method of claim 1 wherein the chalcogen atmosphere is comprised of at least sulfur.

52. The method of claim 1 wherein the chalcogen in the precursor material is an amount greater than or equal to a stoichiometric amount found in the IB-IIIA-chalcogenide film.

53. The method of claim 1 wherein the amount of chalcogen in the precursor material is an amount greater than or equal to the sum of: 1) the stoichiometric amount found in the IB-IIIA-chalcogenide film and 2) a minimum amount of chalcogen necessary to account for chalcogen lost during processing to form the group IB-IIIA-chalcogenide film having the desired stoichiometric ratio.

54. The method of claim 1 wherein the amount of chalcogen is greater than a minimum amount necessary to form the IB-IIIA-chalcogenide film at the desired stoichiometric ratio.

55. The method of claim 1 wherein the amount of chalcogen is about 2 times greater than a minimum amount necessary to form the IB-IIIA-chalcogenide film at the desired stoichiometric ratio.

56. The method of claim 1 wherein the particles are chalcogen-rich particles.

57. The method of claim 1 wherein the particles are selenium-rich particles.

58. The method of claim 1 wherein the particles are sulfur-rich particles.

59. The method of claim 1 wherein the particles are tellurium-rich particles.

60. The method of claim 1 wherein the particles are selenium-rich particles and/or sulfur-rich particles and/or tellurium-rich particles.

61. The method of claim 1 wherein the particles are $IB_X$-$VIA_Y$ and/or $IIIA_a VIA_b$ particles, wherein x<y and a<b.

62. The method of claim 1 wherein the resulting group IB-IIIA-chalcogenide film is $Cu_z In_{(1-x)} Ga_x S_{2(1-y)} Se_{2y}$, where $0.5 \leq z \leq 1.5$, $0 \leq x \leq 1.0$ and $0 \leq y \leq 1.0$.

63. The method of claim 1 wherein the resulting group IB-IIIA-chalcogenide film has a ratio by number of moles of Group IB to Group IIIA elements is greater than about 0.80 and less than about 1.0.

64. The method of claim 1 wherein the particles are substantially oxygen-free particles.

65. The method of claim 1 wherein the particles do not contain oxygen above about 5.0 weight-percentage.

66. The method of claim 1 wherein the group IIIA element comprises gallium and/or indium and/or aluminum.

67. The method of claim 1 wherein the chalcogen is selenium or sulfur or tellurium.

68. The method of claim 1 wherein the particles are alloy particles.

69. The method of claim 1 wherein the particles are binary alloy particles.

70. The method of claim 1 wherein the particles are ternary alloy particles.

71. The method of claim 1 wherein the particles are multinary alloy particles.

72. The method of claim 1 wherein the particles are compound particles.

73. The method of claim 1 wherein the particles are solid-solution particles.

74. The method of claim 1 wherein the precursor material includes group IB-chalcogenide particles containing a chalcogenide material in the form of an alloy of a chalcogen and an element of group IB and/or wherein the particle precursor material includes group IIIA-chalcogenide particles containing a chalcogenide material in the form of an alloy of a chalcogen and one or more elements of group IIIA.

75. The method of claim 1 wherein the group IB-chalcogenide comprises CGS and the group IIIA-chalcogenide comprises CIS.

76. The method of claim 1 further comprising adding an additional source of chalcogen during heating of the precursor material.

77. The method of claim 1 further comprising adding an additional source of chalcogen before, simultaneously with, or after forming the precursor layer.

78. The method of claim 1 further comprising adding an additional source of chalcogen by forming a layer of the additional source over the precursor layer.

79. The method of claim 1 further comprising adding an additional source of chalcogen on the substrate prior to forming the precursor layer.

80. The method of claim 1 further comprising using a vacuum-based process to add an additional source of chalcogen in contact with the precursor layer.

81. The method of claim 1 wherein amounts of the group IB element and amounts of chalcogen in the particles are selected to be at a stoichiometric ratio for the group IB chalcogenide that provides a melting temperature less than a highest melting temperature found on a phase diagram for any stoichiometric ratio of elements for the group IB chalcogenide.

82. The method of claim 1 wherein amounts of the group IIIA element and amounts of chalcogen in the particles are selected to be at a stoichiometric ratio for the group IIIA chalcogenide that provides a melting temperature less than a highest melting temperature found on a phase diagram for any stoichiometric ratio of elements for the group IIIA chalcogenide.

83. The method of claim 1 wherein the suitable atmosphere comprises a selenium atmosphere providing a partial pressure greater than or equal to vapor pressure of selenium in the precursor layer.

84. The method of claim 1 wherein the suitable atmosphere comprises of a non-oxygen atmosphere containing chalcogen vapor at a partial pressure of the chalcogen greater than or equal to a vapor pressure of the chalcogen at the processing temperature and processing pressure to minimize loss of chalcogen from the precursor layer, wherein the processing pressure is a non-vacuum pressure.

85. The method of claim 1 wherein the suitable atmosphere comprises of a non-oxygen atmosphere containing chalcogen vapor at a partial pressure of the chalcogen greater than or equal to a vapor pressure of the chalcogen at the processing temperature and processing pressure to minimize loss of chalcogen from the precursor layer, wherein the processing pressure is a non-vacuum pressure and wherein the particles are one or more types of binary chalcogenides.

* * * * *